(12) United States Patent
Nishizawa et al.

(10) Patent No.: US 7,267,287 B2
(45) Date of Patent: Sep. 11, 2007

(54) IC CARD

(75) Inventors: Hirotaka Nishizawa, Fchu (JP);
Yosuke Yukawa, Kokubunji (JP);
Takashi Totsuka, Machida (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/619,129

(22) Filed: Jan. 2, 2007

(65) Prior Publication Data
US 2007/0102530 A1    May 10, 2007

Related U.S. Application Data

(60) Continuation of application No. 10/408,256, filed on Apr. 8, 2003, which is a division of application No. 09/689,663, filed on Oct. 13, 2000, now Pat. No. 6,573,567.

(30) Foreign Application Priority Data

Dec. 3, 1999 (JP) ................................. 11-344310

(51) Int. Cl.
G06K 19/06 (2006.01)
G06K 7/06 (2006.01)
(52) U.S. Cl. ..................... 235/492; 235/441
(58) Field of Classification Search ........... 235/439, 235/441, 492; 257/679, 681, 723
See application file for complete search history.

(56) References Cited

U.S. PATENT DOCUMENTS

| | | | |
|---|---|---|---|
| 4,816,656 A * | 3/1989 | Nakano et al. ............ | 235/380 |
| 4,896,028 A | 1/1990 | Kushima .................. | 235/492 |
| 4,918,631 A | 4/1990 | Hara et al. ............... | 361/683 |
| 4,962,415 A * | 10/1990 | Yamamoto et al. ........ | 257/679 |
| 5,204,512 A * | 4/1993 | Ieki et al. ................ | 235/382 |
| 5,378,944 A | 1/1995 | Gochi ..................... | 326/105 |
| 5,451,763 A | 9/1995 | Pickett et al. ............ | 235/451 |
| 5,506,499 A | 4/1996 | Puar ....................... | 324/158.1 |
| 5,550,402 A | 8/1996 | Nicklaus ................. | 257/669 |
| 5,671,123 A | 9/1997 | Omori ..................... | 361/737 |
| 5,715,431 A | 2/1998 | Everett et al. ........... | 235/492 |

(Continued)

FOREIGN PATENT DOCUMENTS

JP    4-302164    10/1992

(Continued)

Primary Examiner—Thien M. Le
Assistant Examiner—April A. Taylor
(74) Attorney, Agent, or Firm—Miles & Stockbridge P.C.

(57) ABSTRACT

An IC card capable of reinforcing the prevention of the electrostatic damage without causing a rise in the cost of a semiconductor integrated circuit chip. The semiconductor integrated circuit chip (2) is mounted on a card substrate (1), and plural connection terminals (3) are exposed. The connection terminals are connected to predetermined external terminals (4) of the semiconductor integrated circuit chip, first overvoltage protection elements (7, 8, 9) connected to the external terminals are integrated in the semiconductor integrated circuit chip, and second overvoltage protection elements such as surface-mount type varistors (11) connected to the connection terminals are mounted on the card substrate. The varistors are variable resistor elements having a current tolerating ability greater than that of the first overvoltage protection elements. The varistors have been selected by taking into consideration a relationship between the characteristics and the ability of the first overvoltage protection elements contained in the semiconductor integrated circuit chip, and exhibit the effect for preventing the electrostatic damage.

23 Claims, 24 Drawing Sheets

U.S. PATENT DOCUMENTS

| | | | |
|---|---|---|---|
| 5,988,509 A | 11/1999 | Taskett | 235/379 |
| 5,998,858 A | 12/1999 | Little et al. | 257/578 |
| 5,999,409 A | 12/1999 | Ando et al. | 361/737 |
| 6,002,177 A * | 12/1999 | Gaynes et al. | 257/774 |
| 6,235,553 B1 | 5/2001 | Kawan | 257/659 |
| 6,315,195 B1 | 11/2001 | Ramachandran | 235/380 |
| 6,410,987 B1 | 6/2002 | Kanemoto et al. | 257/777 |
| 6,573,567 B1 | 6/2003 | Nishizawa et al. | 257/358 |
| 6,669,487 B1 | 12/2003 | Nishizawa et al. | 439/60 |
| 6,742,117 B1 | 5/2004 | Hikita et al. | 713/172 |
| 6,843,421 B2 | 1/2005 | Chhor et al. | 235/492 |
| 2001/0023982 A1 | 9/2001 | Wallace | 257/679 |
| 2002/0180060 A1 | 12/2002 | Masuda et al. | 257/777 |
| 2003/0029920 A1 | 2/2003 | Chhor et al. | 325/492 |
| 2004/0046977 A1 | 3/2004 | Silverbrook et al. | 358/1.8 |
| 2004/0169081 A1 | 9/2004 | Azuma | 235/451 |
| 2005/0023361 A1 | 2/2005 | Ikefuji et al. | 235/492 |

FOREIGN PATENT DOCUMENTS

| | | |
|---|---|---|
| JP | 11-204720 | 7/1999 |
| JP | 11-273400 | 10/1999 |

* cited by examiner

CAVITY FOR LABEL

BLANKING PORTION

FORGING PORTION

IC CARD

CROSS-REFERENCE TO RELATED APPLICATIONS

The application is a continuation of application Ser. No. 10/408,256 filed Apr. 8, 2003, which is a division of application Ser. No. 09/689,663 filed Oct. 13, 2000 (now U.S. Pat. No. 6,573,567 issued Jun. 3, 2003).

BACKGROUND OF THE INVENTION

1. Field of the Invention

The present invention relates to technology for suppressing ESD (also called electrostatic discharge damage) of a semiconductor integrated circuit chip mounted on an IC card. More particularly, the invention relates to technology that can be effectively adapted to memory cards such as multi-media cards.

2. Prior Art

A variety of memory cards have heretofore been provided for storing multi-media data in compact sizes having decreased weights. For example, there has been provided a multi-media card having a memory and a memory controller mounted on a card substrate, establishing an interface to a host unit using a small number of signals.

Giving priority to a small size and reduced weight, the memory card of this type has the connection terminals for connection to the host unit, the connection terminals being exposed on the card substrate, but has no particular mechanism such as cover for protecting the terminals. When the exposed terminals are touched at the time when the memory card is removed from the host unit, therefore, a semiconductor integrated circuit chip connected to the exposed terminals may be damaged. Usually, the semiconductor integrated circuit chip is provided with an input protection circuit for preventing the input circuit from the electrostatic damage. The input protection circuit is constituted by, for example, disposing, between an input terminal and a power source terminal, an element such as a diode whose connection state is reversed relative to the amplitude voltage of the input signal. It is, however, expected that the memory card is carried by itself and is frequently attached to, and detached from, the host unit. Thus, the present inventors have found the importance of reinforcing the prevention of the electrostatic damage.

Though the technical field is different from the above memory card, Japanese Patent Laid-Open No. 209379/1998 discloses technology for reinforcing the protection of input against the electrostatic damage. According to this technology, a metal wiring layer is formed maintaining a gap (discharge gap) in which static electricity could be discharged relative to an electrode layer on a semiconductor substrate so that when static electricity has entered into the electrode layer, the static electricity is discharged to the metal wiring layer, preventing the static electricity that has entered into the electrode layer from entering into the semiconductor element. Further, Japanese Patent Laid-Open No. 271937/1995 discloses a circuit employing a gate-source protection diode of a MOSFET that is externally attached to a semiconductor integrated circuit chip to prevent the electrostatic damage.

There has further been provided a varistor of semiconductor ceramics from the standpoint of protecting the circuitry from an overvoltage.

SUMMARY OF THE INVENTION

The present inventors have forwarded the following study from the standpoint reinforcing the prevention of electrostatic damage of the IC card such as a memory card having connection terminals that are exposed.

First, it became obvious that when Zener diodes of a large size are integrated on a semiconductor integrated circuit chip to obtain an energy withstand amount that helps reinforce the prevention of electrostatic damage, the area efficiency decreases in the midst of fine circuit elements, driving up the cost to a conspicuous degree.

Second, when an element for protection from an overvoltage is attached to the semiconductor integrated circuit chip to reinforce the prevention of electrostatic damage, the efficiency for preventing the electrostatic damage does not increase unless consideration is given to a relationship between the characteristics and the ability of the overvoltage protection circuit incorporated in the semiconductor integrated circuit chip. Besides, the externally attached circuit elements that are large in size or that are large in number, cause an increase in the size and thickness of the IC card. Such a viewpoint has not been taught by the above prior art. In this specification, the overvoltage stands for a surge voltage or a transient voltage that generates electrostatically.

Third, even when the countermeasure against the electrostatic damage is taken by using the externally attached circuit elements, there is no guarantee that the device is absolutely safe from the damage when it is handled in an unexpected manner by a person who is not familiar with. It is therefore necessary to make perfection more perfect.

Fourth, even when the input circuit of the semiconductor integrated circuit is electrostatically damaged, it can be expected that the data in the memory remain safe. In such a case, recovering the data from the memory card gives an excellent feature relieving the data and offering an increased safety of the memory card as a storage medium.

Fifth, a countermeasure against the electrostatic damage by the externally attached circuit elements, decreases, at least, the vacant region on the card substrate correspondingly. Even in this case, it becomes necessary to avoid concentration of wiring patterns and the concentration of bonding wires that could become a cause of malfunction due to undesired leakage of signal lines. This contrivance is necessary even when the memory capacity of the memory card is to be increased.

The present invention provides an IC card capable of reinforcing the prevention of electrostatic damage without driving up the cost of the semiconductor integrated circuit chip.

The present invention further provides an IC card capable of reinforcing the prevention of electrostatic damage by attaching overvoltage protection elements to the semiconductor integrated circuit chip without causing a great change in the size and thickness of the card.

The invention further provides an IC card which can be expected to prevent electrostatic damage caused by an unexpected handling by a person who is not familiar with.

The invention further provides an IC card capable of easily recovering the data in the memory card even when the input circuit of the semiconductor integrated circuit chip is electrostatically damaged, provided the data in the memory remain safe.

The invention further provides an IC card capable of avoiding the concentration of wiring patterns and bonding wires that could cause a malfunction due to undesired leakage of signal lines even when the vacant region on the card substrate is decreased by the countermeasure against the electrostatic damage by externally attaching the circuit elements.

The invention further provides an IC card having a relatively large storage capacity in a relatively small size.

The above and other objects as well as novel features of the present invention will become obvious from the description of the specification and the accompanying drawings.

Briefly described below are representative examples of the invention disclosed in this application.

[1] Second overvoltage protection elements capable of reinforcing the prevention of electrostatic damage are externally attached to the semiconductor integrated circuit chip by taking into consideration a relationship to first overvoltage protection elements that are integrated in a semiconductor integrated circuit chip. That is, an IC card has a semiconductor integrated circuit chip mounted on a card substrate and plural connection terminals that are exposed, wherein the connection terminals are connected to predetermined external terminals of the semiconductor integrated circuit chip, the first overvoltage protection elements connected to the external terminals are integrated on the semiconductor integrated circuit chip, and the second overvoltage protection elements connected to the connection terminal are mounted on the card substrate.

According to a first aspect, the second overvoltage protection elements are variable resistor elements having a current tolerating ability greater than that of the first overvoltage protection elements.

According to a second aspect, a voltage greater than a rated voltage applied to the second overvoltage protection elements for flowing a specified pulse current, is the voltage that enables the first overvoltage protection elements to flow only a current smaller than the above specified pulse current.

According to a third aspect, the second overvoltage protection elements are variable resistor elements having a breakdown voltage larger than that of the first overvoltage protection elements.

According to a fourth aspect, the second overvoltage protection elements have a capacity larger than that of the first overvoltage protection elements.

This enables a high-speed surge pulse to be by-passed through a low resistance.

According to a fifth aspect, the second overvoltage protection elements have a breakdown voltage smaller than a breakdown voltage of the first overvoltage protection elements.

According to a sixth aspect, the second overvoltage protection elements has a breakdown voltage smaller than a breakdown voltage of a circuit that is protected by the first overvoltage protection elements.

In any aspect, it can be said that the second overvoltage protection elements exhibit the effect for preventing the electrostatic damage, since consideration has been given to a relationship between the characteristics and the ability of the first overvoltage protection elements that are contained in the semiconductor integrated circuit chip.

The second overvoltage protection elements may have their ends on one side thereof connected to the power source connection terminals of the card substrate and may have their ends on the other side thereof connected to the signal connection terminals. The signal connection terminals are connected to the corresponding external terminals of the semiconductor integrated circuit chip. Here, the signal propagation distances from the signal connection terminals to the corresponding second overvoltage protection elements are shorter than the signal propagation distances from the signal connection terminals to the corresponding external terminals of the semiconductor integrated circuit chip. This prevents the semiconductor integrated circuit chip from being directly affected destructively by the overvoltage before the second overvoltage protection elements work in response to the overvoltage.

The second overvoltage protection elements may be varistors of the surface-mount type comprising chiefly semiconductor ceramics, an array of chip diodes, chip capacitors or chip transistors. This makes it possible to decrease the mounting area or the occupation area of the second overvoltage protection elements. The surface mounting lowers the cost of production.

When a memory card such as a multi-media card is used as an IC card, the semiconductor chip is a controller chip, and one or plural memory chips (e.g., nonvolatile memory chips) connected to the controller chip are further mounted on the card substrate. The controller chip has a memory control function for controlling the reading/writing operation for the memory chips according to an instruction from an external unit.

When a consideration is given to data security and copyright, the controller chip may employ a privacy protection function for effecting the encryption for the data written into the memory chip and for effecting the decryption for the data read out from the memory chip.

When a consideration is given to preventing the electrostatic damage even during the steps of manufacturing the IC card, the second overvoltage protection elements connected to the connection terminals should be mounted on the card substrate, first, and, then, predetermined external terminals of the semiconductor integrated circuit chip should be connected to the connection terminals. Then, the protection by the second overvoltage protection elements is obtained in a step of connecting the semiconductor integrated circuit chip.

[2] The invention is concerned with an IC card having a semiconductor integrated circuit chip mounted on a card substrate, wherein plural connection terminals are exposed, predetermined external terminals of said semiconductor integrated circuit chip are connected to the connection terminals, first overvoltage protection elements connected to the external terminals are integrated on the semiconductor integrated circuit chip, and second overvoltage protection elements connected to the connection terminals are mounted on the card substrate, and wherein the second overvoltage protection elements may be connected by being surface-mounted on the electrically conducting pattern formed on the card substrate. This makes it possible to decrease the cost of mounting the second overvoltage protection elements.

When a memory card such as a multi-media card is used as the IC card, the semiconductor chip is a controller chip, and one or plural memory chips connected to the controller chip are further mounted on the card substrate. Here, bonding wires are used for connecting the connection terminals to the external terminals of the controller chip, and bonding wires are used for connecting the controller chip to the memory chips. Therefore, a number of wiring patterns having the same function as the connection by the bonding wires, need not be densely formed on the is card substrate. Space on the controller chip or the memory chips can be used for the wiring. Accordingly, this contributes to decreasing the cost of the card substrate.

When plural memory chips are to be connected in parallel to the controller chip by bonding wires, the memory chips may be mounted on the card substrate in a manner that the chips are stacked one upon the other with their positions being so deviated that the external terminals are exposed, from the standpoint of shortening the lengths of the bonding wires. Therefore, the distance to the controller chip is shortened and the lengths of the bonding wires are shortened compared to when the memory chips are arranged without being stacked one upon the other. This decreases the probability of undesired contact or breakage of the bonding wires. In this case, in particular, a condition should be maintained in that the area on one surface of the card substrate is larger than the total areas of the memory chips and of the controller chip. This is to provide the card substrate with extra space for sufficiently coping with a restrictive condition in that the wiring layer is formed on one surface only of the card substrate. This is not a simple idea of mounting the memory chips in a stacked manner for decreasing the area of the card substrate.

[3] The invention is concerned with an IC card in which plural memory chips and the controller chip for controlling the memory chips are mounted on one surface of the card substrate, wherein when the memory chips are mounted on the card substrate in a manner of being stacked one upon the other with their positions being so deviated that the external terminals are exposed, the external terminals of the memory chips that receive the same signals from the controller chip are successively connected in series by bonding the wires. The bonding method of a so-called stitch sewing is employed. The bonding wires can be shortened as a whole compared to when the controller chip is connected to the external terminals through the bonding wires. In this respect, too, the probability of undesired contact or breakage of lines due to the concentration of the bonding wires can be decreased.

The invention is concerned with an IC card in which plural memory chips and the controller chip for controlling the memory chips are mounted on one surface of the card substrate, wherein when the memory chips are mounted on the card substrate in a manner of being stacked one upon the other with their positions being so deviated that the external terminals are exposed, the external terminals for receiving chip selection signals of the memory chips are located at the ends of the arrangements of the external terminals of the nonvolatile memory chips, and are connected to the controller chip by bonding the wires. In a constitution for separately selecting the plural memory chips, the external terminals for receiving the chip selection signals must be separately connected to the external terminals for outputting the chip selection signal of the controller chip. Therefore, the above stitch-bonding method cannot be employed. However, the external terminals for selecting the chips are arranged at the ends of the memory chips and work to accomplish necessary connection without hindered by other bonding wires.

[4] The memory chips and the controller chip mounted on the card substrate may be arranged in the form of columns. That is, the memory chips are connected to the controller chip, the connection terminals formed on the card substrate are connected to predetermined external terminals of the controller chip, the first overvoltage protection elements connected to the external terminals are integrated on the controller chip, and the second overvoltage protection elements connected to the connection terminals are mounted on the card substrate. The distances from the connection terminals are increased in order of the second overvoltage protection elements, controller chip, and plural memory chips, which are arranged like columns from one side of the card substrate to the opposing side thereof. Owing to this column-like arrangement, the second overvoltage protection elements for finally releasing the overvoltage are located closest to the connection terminals to which an overvoltage is applied, and the memory chips storing the data are located remotest, offering a high reliability from the standpoint of preventing electrostatic damage to the semiconductor chip and protecting the data.

In this case, too, the memory chips may be mounted on the card substrate in a manner of being stacked one upon the other with their positions being so deviated that the external terminals are exposed.

The arrangement of the memory chips and the controller chip mounted on the card substrate is not limited to the column-like arrangement only. When plural connection terminals are arranged along one side between the two neighboring sides of the card substrate, the memory controller is arranged with its lengthwise direction in parallel with the other side of the two neighboring sides, and plural memory chips are arranged in parallel in a direction nearly at right angles with the direction in which the connection terminals are arranged. The connection terminals exposed from the card substrate are connected to predetermined external terminals of the controller chip, the first overvoltage protection elements connected to the external terminals are integrated on the controller chip, and the memory chips are connected to the controller chip. With the connection terminals and the controller chip being arranged along the neighboring two sides of the card substrate, it is allowed to easily increase the density for mounting the memory chips or to increase the number of mounts. If the memory chips are arranged in parallel being divided into a first group in which the memory chips are stacked in a plural number with their positions being so deviated that the external terminals are exposed and a second group in which the memory chips are stacked in a plural number in the same manner, the height of the IC card can be suppressed. The second overvoltage protection elements connected to the connection terminals may be mounted on the card substrate along the direction in which the connection terminals are arranged.

[5] When an IC card is constituted by forming electrically conducting patterns on both surfaces of the card substrate, the electrically conducting patterns may be connected by using through holes that are penetrating through the card substrate. In this case, it is desired that the through holes are arranged outside the molded region that covers the semiconductor integrated circuit chip and the other surface of the card substrate. The molding that is executed while applying a pressure eliminates the probability in that the molding resin flows into the back side of the card substrate passing through the holes.

When the through holes are formed for the connection terminals exposed from the IC card, it is desired that the through holes are formed at positions deviated from the slide surfaces of the connection terminals. Even when the IC card is attached to, or detached from, the mounting slot, therefore, the terminals of the slot do not come into slide contact with the through holes and do not receive mechanical force, preventing such a probability that the patterns of the connection terminals are cracked from the through holes and are damaged.

The invention is concerned with an IC card in which plural connection terminals are exposed on one surface of a card substrate, a semiconductor integrated circuit chip is mounted on the other surface of the card substrate, predetermined external terminals of the semiconductor integrated circuit chip are connected to the connection terminals, first overvoltage protection elements connected to the external terminals are integrated on the semiconductor integrated circuit chip, and second overvoltage protection elements connected to the connection terminals are mounted on the other surface of the card substrate, and wherein the semiconductor integrated circuit chip, the second overvoltage protection elements and the other surface of the card substrate are covered with a metal cap. The metal cap can be formed by reducing a metal plate, by a forging method or by a die casting method. This provides a countermeasure against EMI (electromagnetic interference) compared to the resin cap, and helps accomplish the sealing by mechanical fastening and accomplish the cap-sealing at a high temperature. The resin cap may be blended with an electromagnetic wave-absorbing material such as ferrite, etc. To cope with ESD, electrically conducting particles such as carbon may be mixed.

An electrically conducting shielding pattern may be employed for the card substrate to relax the effect of electrostatic discharge that takes place near the card substrate. That is, the invention is concerned with an IC card in which plural connection terminals are exposed on one surface of a card substrate, and a semiconductor integrated circuit chip is mounted on the other surface of the card substrate, wherein predetermined external terminals of the semiconductor integrated circuit chip are connected to the connection terminals, first overvoltage protection elements connected to the external terminals are integrated on the semiconductor integrated circuit chip, second overvoltage protection elements connected to the connection terminals are mounted on the other surface of the card substrate, and an electrically conducting shielding pattern is formed on one surface of the card substrate except a region of the connection terminals, the electrically conducting shielding pattern being connected to the connection terminal for supplying ground power source or being connected to none of the connection terminals. The electrically conducting shielding pattern disperses the static electricity.

[6] From the standpoint of preventing electrostatic damage of when the IC card is handled in an unexpected manner by a person who is not familiar with, the IC card is provided on the surface thereof with an indication indicating a position where the IC card should be held by fingers (figure of a finger printed on a position at where the IC card should be held by fingers at the time of attachment or detachment), the IC card mounting a semiconductor integrated circuit chip permitting plural connection terminals to be exposed. Further, a notice is written on the surface of the IC card warning not to touch the connection terminals. Besides, a notice is written on the packing member packing the IC card warning not to touch the connection terminals of the IC card.

[7] The invention deals with a IC card giving attention to recovering the stored data, wherein plural connection terminals are exposed, plural memory chips and a controller chip for controlling the memory chips are mounted on a card substrate, the connection terminals are connected to a first group of external terminals of the controller chip, the memory chips are connected to a second group of external terminals of the controller chip, and data evaluation terminals connected to the second group of external terminals are formed on the card substrate.

In case the controller chip becomes no longer capable of executing the memory control due to electrostatic damage, access can be made directly to the memory chips from an external unit through the data evaluation terminals. Therefore, even when the controller chip is destroyed, the data remaining in the memory chips can be easily recovered.

The card substrate may further be provided with a control terminal for controlling the output terminal included in the second group of external terminals of the controller chip to assume a high output impedance state. The damaged controller chip that is placed in an undesired signal output state, can be easily relieved.

The controller chip may often be provided with a privacy protection mechanism for executing the encryption for the data that are written into the memory chips and for executing the decryption for the data read out from the memory chips. In this case, the data are recovered by the manufacturer of the IC card or by an authorized person by decrypting the data read out from the memory chips.

[8] The simplest method of recovering the data from the IC card having the data evaluation terminals, includes a first processing for placing the memory chips in a state where they cannot be controlled by the controller chip, and a second processing for reading out the data from the data evaluation terminals by controlling the memory chips. A data recovery method of when the controller chip has the privacy protection function, includes a first processing for controlling the output terminal included in the second group of external terminals of the controller chip to assume a high output impedance state, a second processing for reading out the data from the data evaluation terminals by controlling the memories, a third processing for decrypting the data read out by the second processing, and a fourth processing for writing the data decrypted by the third processing into another IC card.

Therefore, even in case the input circuit of the semiconductor integrated circuit chip is electrostatically damaged, the data that remain safe in the memory can be easily recovered.

DESCRIPTION OF THE PREFERRED EMBODIMENTS

<Reinforcing the Function for Preventing Electrostatic Damage by Using Varistors>

First, described below is a principle for reinforcing the function for preventing electrostatic damage to the semiconductor integrated circuit by using externally attached circuit elements such as varistors.

Figure 1:
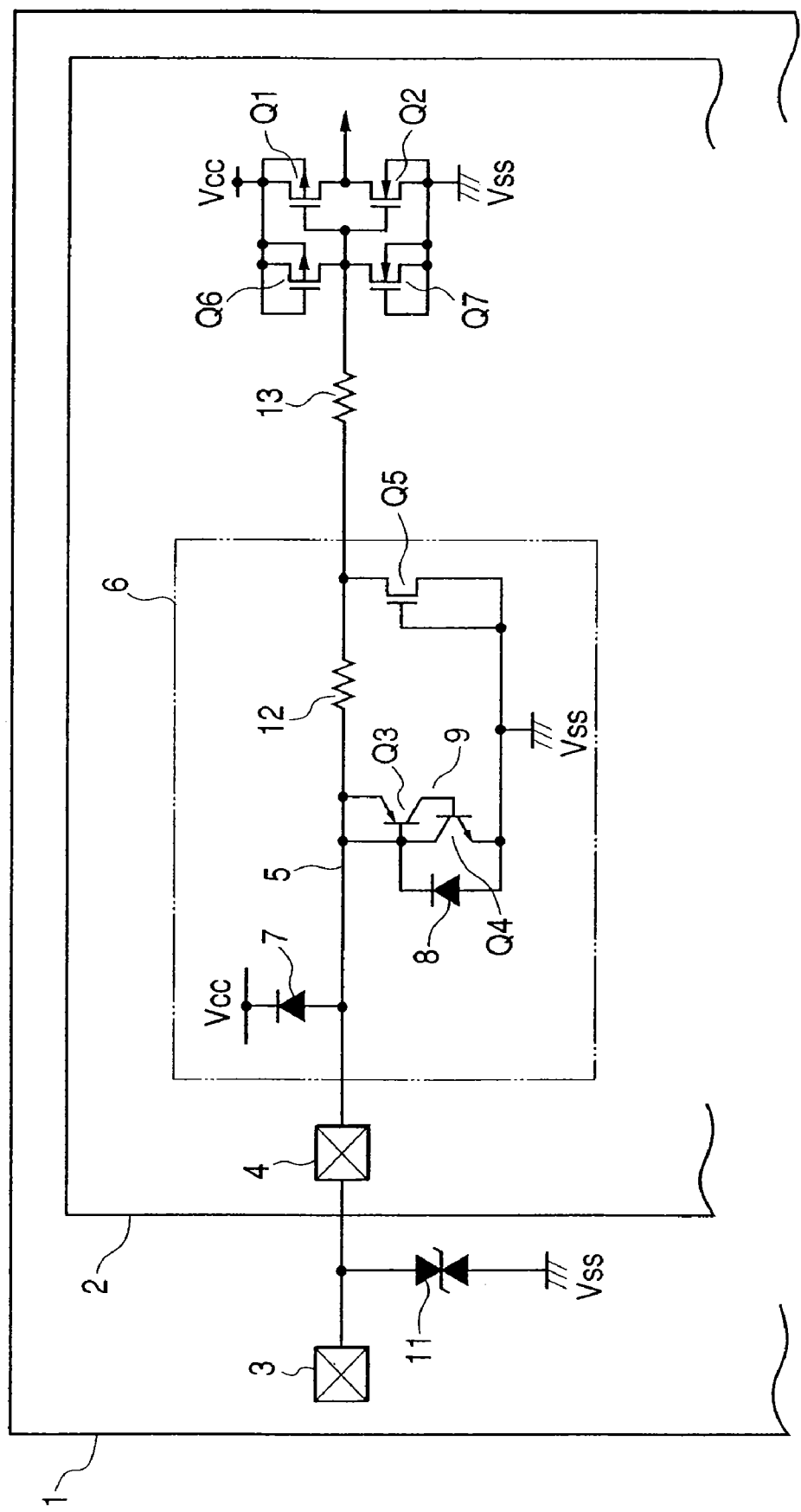
FIG. 1 is a circuit diagram illustrating a connection terminal of an IC card according to the present invention.

FIG. 1 illustrates a connection terminal of an IC card according to the invention. The IC card that is shown has a semiconductor integrated circuit chip 2 mounted on a card substrate 1, and, typically, has connection terminals 3 that are exposed. The connection terminals 3 are interface terminals for electrically connecting the IC card to a host unit to which the IC card is detachably attached.

The connection terminals 3 are connected to predetermined external terminals 4 of the semiconductor integrated circuit chip 2. The external terminals are input terminals which are connected to, for example, a CMOS inverter in the initial stage of the input circuit via signal lines 5. The CMOS inverter is constituted by a p-channel field-effect transistor (often described as unit MOS transistor) Q1 and an n-channel MOS transistor Q2 disposed in series between a ground terminal Vss and a power source terminal Vcc of the circuit. In the semiconductor integrated circuit chip 2 are integrated diodes 7, 8 which are first overvoltage protection elements connected to the external terminal 4, a thyristor 9 and a clamping MOS transistor Q5. On the card substrate 1 is mounted a varistor 11 which is a second overvoltage protection element connected to the connection terminal 3. The diodes 7, 8, thyristor 9 and clamping MOS transistor Q5 constitute an input protection circuit 6.

The concept of cathode and drain of the MOS transistor is determined depending upon the direction of the operation voltage. In this specification, for convenience, the names determined in the state of normal operation by the operation voltages Vss and Vcc are used as the names of terminals.

The anode of the diode 7 is connected to the input signal line 4, the cathode thereof is connected to the power source terminal Vcc, the cathode of another diode 8 is connected to the input signal line 4 and the anode thereof is connected to the ground terminal Vss. The thyristor 9 is equivalently constituted by a pnp transistor Q3 and an npn transistor Q4, and the anode thereof is connected to the input signal line 4, and the cathode thereof is connected to the ground terminal Vss. The MOS transistor Q5 is a clamping MOS transistor of the form of a so-called diode connection of which the gate and source are connected to the ground terminal Vss and of which the drain is connected to the input signal line 4.

Reference numerals 12 and 13 are input protection resistors. Symbols Q6 and Q7 are a p-channel clamping MOS transistor of the form of a so-called diode connection of which the gate and source are connected together and an n-channel clamping MOS transistor. The clamping MOS transistors Q6 and Q7 are circuit elements having an auxiliary function to cope with the case where an overvoltage has leaked from the input protection circuit 6. When used alone, they cannot work as the first overvoltage protection element but work as the overvoltage protection element in cooperation with other circuit element.

In a normal state, the connection terminal 3 receives a signal having a voltage amplitude between the ground voltage Vss and the power source voltage Vcc. In this case, the diodes 7, 8, thyristor 9, and clamping MOS transistors Q5, Q6 and Q7 are all connected in a reversed manner.

When an overvoltage of a positive polarity is applied to the connection terminal 3 due to electrostatic discharge, the diode 7 is connected in the forward direction, the anode of the thyristor 9 is turned on in excess of the element voltage in the forward direction, whereby the overvoltage flows into the power source voltage Vcc and the ground voltage Vss, and is blocked from flowing into the succeeding stages or flows in a decreased amount. The clamping MOS transistor Q6 is turned on when the overvoltage of the positive polarity leaks even by a small amount, and permits the overvoltage to flow into the power source voltage Vcc.

On the other hand, when an overvoltage of a negative polarity is applied to the connection terminal 3 due to electrostatic discharge, the diode 8 is connected in the forward direction and the clamping MOS transistor Q5 is turned on, whereby the overvoltage flows into the ground voltage Vss, and is blocked from flowing into the succeeding stages or flows in a decreased amount. The clamping MOS transistor Q7 is turned on when the overvoltage of the negative polarity leaks even by a small amount, and permits the overvoltage to flow into the ground voltage Vss.

The varistor 11 is a circuit element which assumes the overvoltage element operation before the overvoltage element operation of the input protection circuit 6 reaches its limit, and reinforces the function for preventing electrostatic damage or reinforces the overvoltage protection function. The varistor 11 is equivalent to a circuit in which the Zener diodes are connected back to back, or can be replaced thereby.

Here, the varistor 11 is a laminated chip varistor using semiconductor ceramics. Referring to an axial sectional view of FIG. 2, the varistor 11 has the shape of a small chip that can be surface-mounted, has electrically conducting side electrodes 20 and 21 at both ends, the one side electrode 20 being provided with a pair of interlayer electrodes 22 and 23 extending toward the other side electrode 21, the other side electrode 21 being provided with another interlayer electrode 24 located between the pair of interlayer electrodes 22 and 23, and extending toward the one side electrode 20, and the gaps among the side electrodes 20, 21 and the interlayer electrodes 22, 23, 24 being filled with semiconductor ceramics 25.

Figure 3:
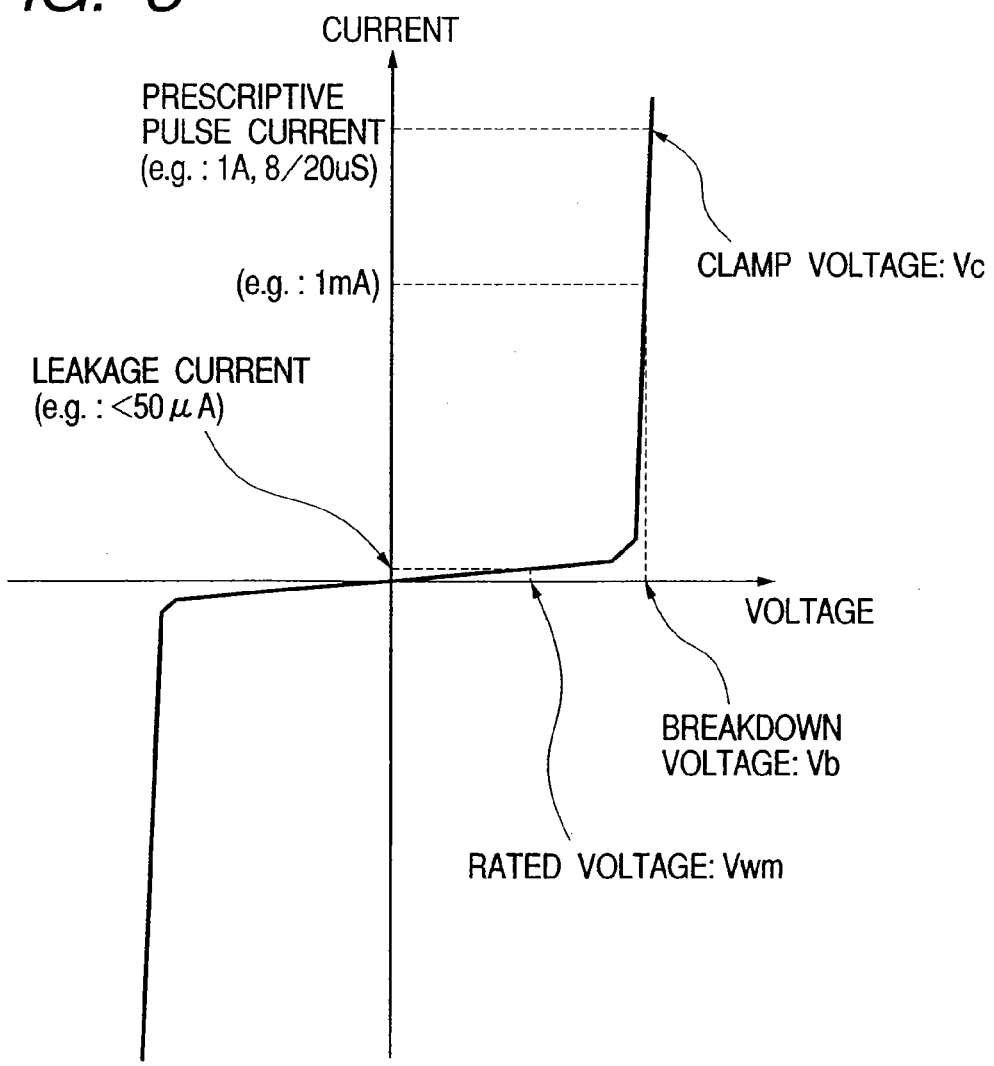
FIG. 3 is a diagram of an I-V line illustrating the characteristics of the varistor.

FIG. 3 illustrates characteristics of the varistor 11. The varistor 11 is a variable resistor element having current—voltage (I-V) characteristics as shown in FIG. 3, operates on a leakage current of not larger than 50 μA in a state where it is normally used, and does not affect the input of signals through the connection terminal 3 in a state where the device is practically used. This state is obtained by using the device at a voltage which is not higher than a rated voltage (also called use voltage) Vwm specific to the varistor as described in a data sheet thereof. When an abnormally high voltage enters into the semiconductor integrated circuit chip, the input protection circuit in the semiconductor integrated circuit chip starts working at a relatively low voltage. However, the current tolerating ability of the overvoltage protection element such as diode in the input protection circuit becomes no longer sufficient for the overvoltage, and the current saturates. Accordingly, the operation current starts flowing into the varistor 11. Then, as the overvoltage reaches near the breakdown voltage (Vb), the resistance so decreases that the voltage becomes almost constant irrespective of the current. For larger transient voltage, the varistor prevents the electrostatic damage to the semiconductor integrated circuit chip owing to its high energy allowance value with the clamp voltage (Vc) as a theoretical upper limit.

Let it now be presumed a case where a voltage of 10 kilovolts which is far greater than an electrostatic breakdown voltage of several hundred volts to 2 kilovolts of the semiconductor integrated circuit chip, is applied at a current of 1000 A for 10 nanoseconds (10 nS) to the IC card to which a varistor 11 having an energy withstand level of 0.2 J (Joule) is attached. In this case, the amount of energy is 10 kV×1000 A×10 nS=0.1 J. This amount of energy is smaller than the above energy withstand level of the varistor 11, and the electrostatic damage is prevented.

In FIG. 3, the clamp voltage Vc can be specified to be a prescriptive pulse current, i.e., as a terminal voltage (voltage across the side electrodes) of when a current of 1 A is supplied for 8.20 seconds, and the breakdown voltage Vb can be specified to be a terminal voltage of when, for example, a current of 1 mA is supplied. If described qualitatively, the breakdown voltage Vb can be defined as a voltage which easily enables the I-V characteristics to be reversed even when a direct current is applied within the range. The clamp voltage can be defined to be a voltage that is very likely to lead to the breakage when it is exceeded several times.

The characteristics of the varistor 11 can be specified to be as described below by taking into consideration the characteristics of the overvoltage protection element of the input protection circuit 6.

First, the varistor 11 can be specified to be a variable resistance element having an current tolerating ability in excess of that of the diodes 7, 8, thyristor 9 and clamping MOS transistor Q5 in the input protection circuit 6, or in excess of that of the clamping MOS transistors Q6 and Q7.

Second, a voltage such as a breakdown voltage Vb or a voltage close thereto larger than a rated voltage applied to the varistor 11 for flowing a specified pulse current, is the voltage that enables the diodes 7, 8, thyristor 9, clamping MOS transistor Q5 in the input protection circuit 6, and the clamping MOS transistors Q6 and Q7 to flow only a current smaller than the above specified pulse current, if they are not broken.

Third, the varistor 11 is a variable resistance element having a breakdown voltage larger than those of the diodes 7, 8, thyristor 9 and clamping MOS transistor Q5 in the input protection circuit 6, and than those of the clamping MOS transistors Q6 and Q7.

Fourth, the varistor 11 is a variable resistance element having a stray capacity larger than those of the diodes 7, 8, thyristor 9 and clamping MOS transistor Q5 in the input protection circuit 6, and than those of the clamping MOS transistors Q6 and Q7. As will be understood from the structure of FIG. 2, when used for the power source terminal, it is obvious that the semiconductor ceramics has a relatively large capacitive component though it is not a dielectric. Thus, the stray capacity works to relax the change in the transient voltage, and is effective for preventing the electrostatic damage when the stray capacity is large. When used for signal terminals, the capacity must be decreased to lie within a permissible range so as to respond to high-speed signals.

Fifth, the breakdown voltage of the varistor 11 is smaller than the breakdown voltages of the diodes 7, 8, thyristor 9 and clamping MOS transistor Q5 in the input protection circuit 6, and than those of the clamping MOS transistors Q6 and Q7. The varistor 11 breaks down before the input protection circuit 6 is damaged to let the overvoltage be released.

Sixth, the breakdown voltage of the varistor 11 is smaller than the breakdown voltages of the diodes 7, 8, thyristor 9 and clamping MOS transistor Q5 in the input protection circuit 6, and than that of a circuit protected by the clamping MOS transistors Q6 and Q7, such as of a CMOS inverter circuit constituted by MOS transistors Q1 and Q2.

As described above, the varistor 11 has been selected by taking into consideration the relationship between the characteristics and the ability of the overvoltage protection elements such as diodes 7, 8 constituting the input protection circuit 6 contained in the semiconductor integrated circuit chip 2. Accordingly, the varistor 11 efficiently exhibits the effect for preventing the electrostatic damage.

The signal propagation distance from the connection terminal 3 to the varistor 11 is shorter than the signal propagation distance of from the connection terminal 3 to a corresponding external terminal 4 of the semiconductor integrated circuit chip 2. This makes it possible to prevent the semiconductor integrated circuit chip 2 from directly receiving destructive effect due to an overvoltage before the varistor 11 functions in response to the overvoltage.

The varistor 11 is of the source-mounting type comprising chiefly semiconductor ceramics. Therefore, the mounting area or the occupation area of the varistor 11 can be decreased. The surface mounting helps decrease the cost of producing the IC card.

<Application to a Multi-media Card>

Described below is an embodiment in which the IC card using the varistor 11 is applied to a multi-media card.

Figure 4:
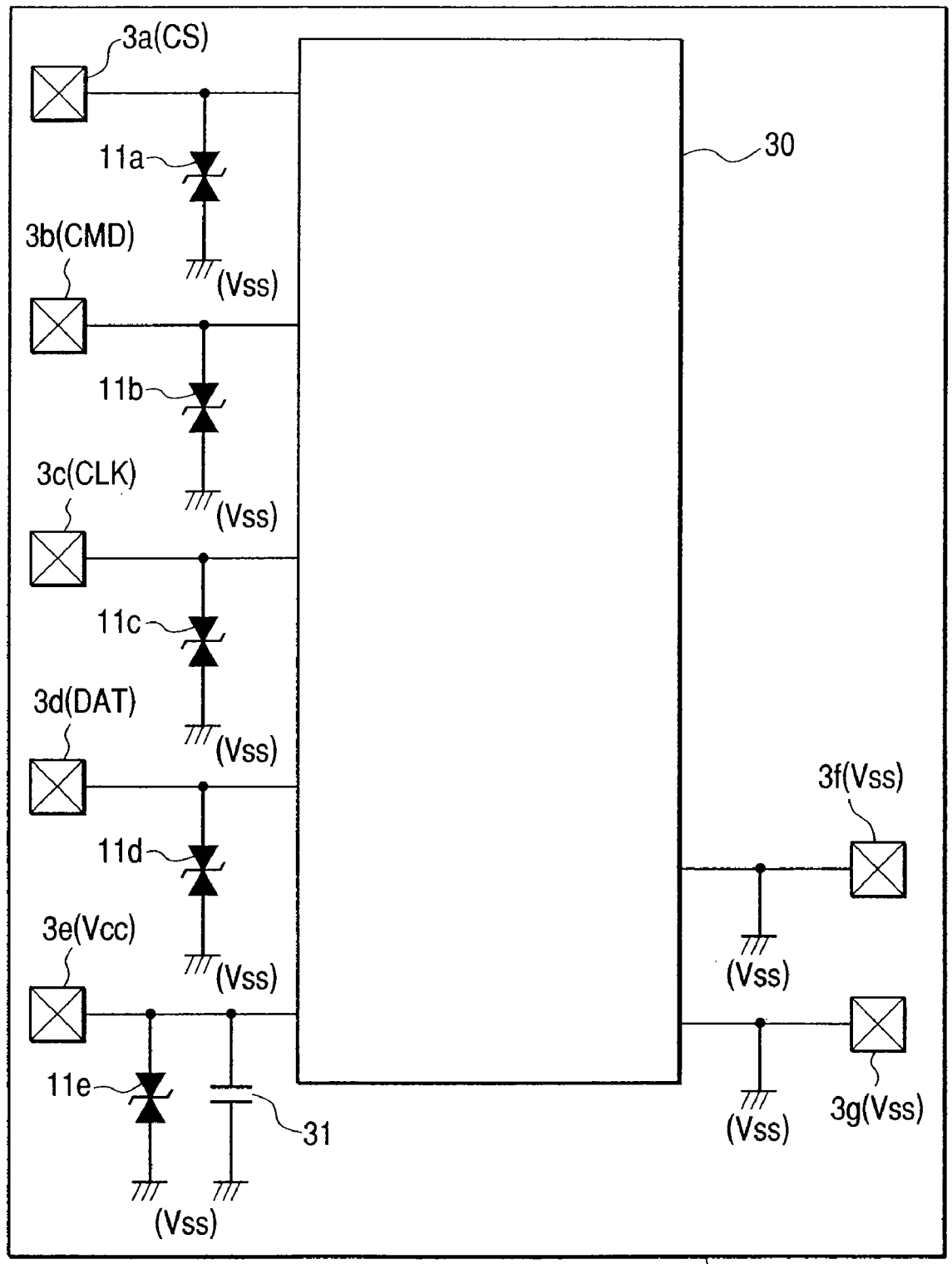
FIG. 4 is a diagram illustrating the connection of the varistors to the connection terminals of a multi-media card.

FIG. 4 is a diagram illustrating the connection of the varistors to the connection terminals of the multi-media card. According to the specifications by the Group of Standardization, the multi-media card has a size measuring 24 mm×32 mm×1.4 mm. The card substrate 1 has connection terminals, i.e., a connection terminal 3a for receiving a chip select signal CS, a connection terminal 3b for receiving a command CMD, a connection terminal 3c for receiving a clock signal CLK, a connection terminal 3d for inputting and outputting data DAT, a connection terminal 3e served with a power source voltage Vcc, and two connection terminals 3f and 3g served with ground voltage Vss. The connection terminals 3a to 3g are connected to the controller chip and to the nonvolatile memory chips that are not shown but that are mounted on a region designated at 30 in the drawing. In FIG. 4, the arrangement of the connection terminals 3a to 3g is different from that of the practical multi-media card.

Varistors 11a to 11e are mounted on the card substrate 1 among the connection terminals 3a to 3e and between the connection terminals 3e and 3g. In FIG. 4, the varistor is provided in a number of one for each corresponding terminal. The varistors, however, may be provided in a plural number being connected in series.

In particular, the varistor 11e disposed for the connection terminal 3e that receives the power source voltage Vcc, works as a by-pass capacitor. Therefore, the varistor 11e may be replaced by a by-pass capacitor, or a by-pass capacitor 31 may be arranged in parallel as shown in FIG. 4.

Figure 5:
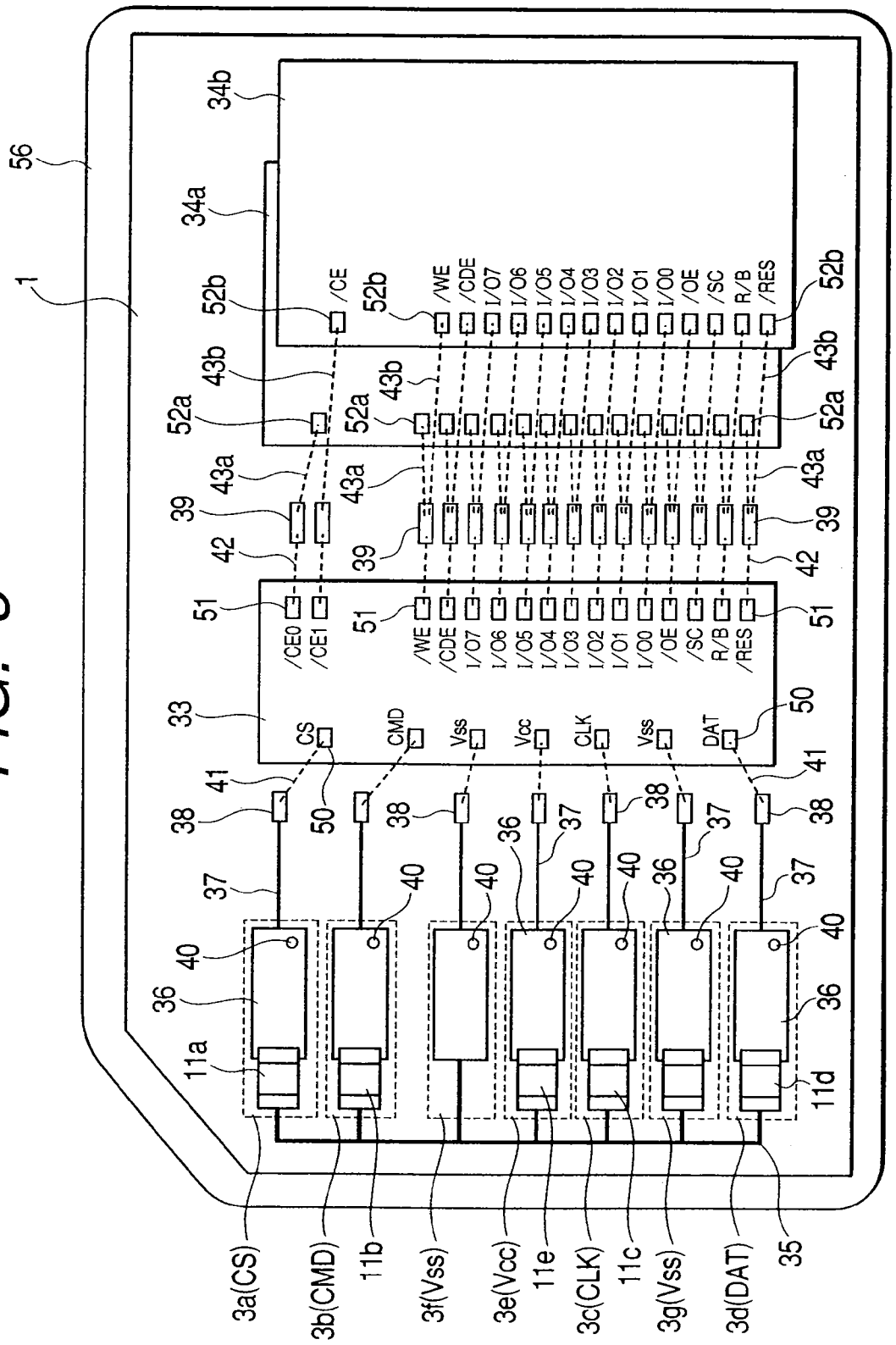
FIG. 5 is a diagram illustrating, on a plane, the constitution of the multi-media card chiefly in a state where the circuit elements are mounted.
Figure 6:
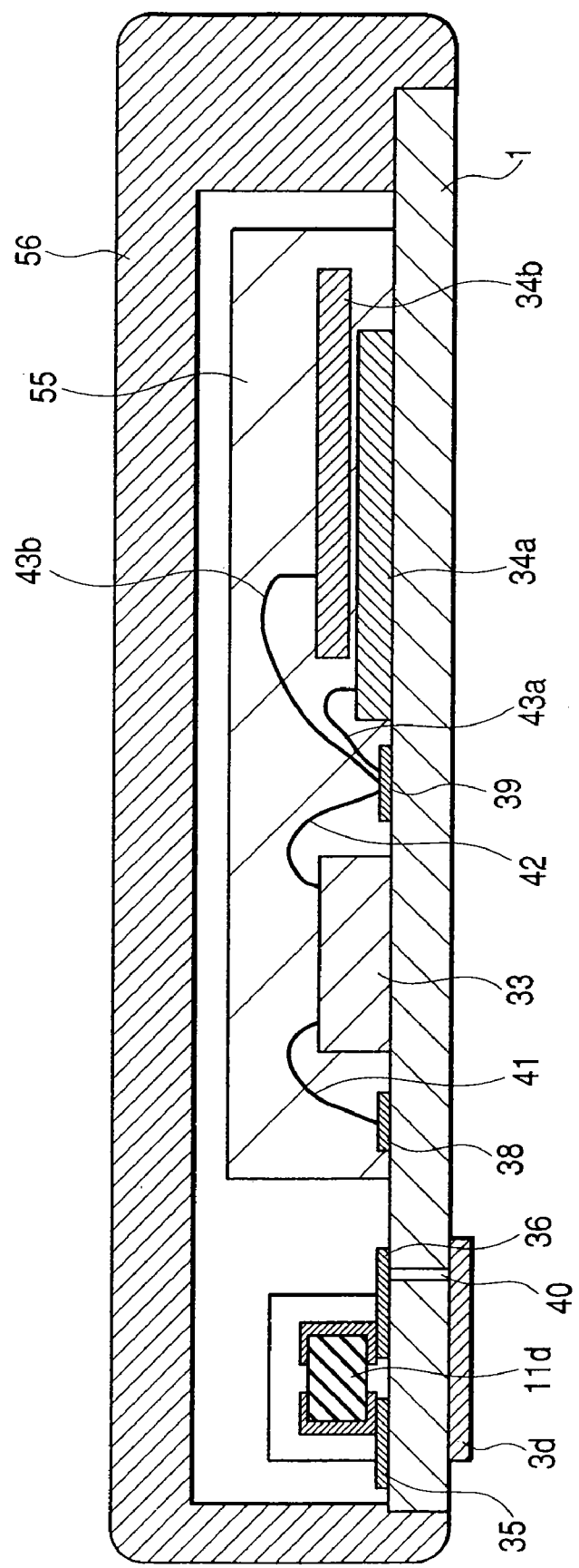
FIG. 6 is a vertical sectional view of the multi-media card of FIG. 5.

FIG. 5 illustrates on a plane the constitution of the multi-media card mounting chiefly the circuit elements, and FIG. 6 is a vertical sectional view thereof. The card substrate 1 is constituted by a glass epoxy resin, and has, on the back surface thereof, the connection terminals 3a to 3g formed as electrically conducting patterns. On the surface of the card substrate 1 are mounted the varistors 11a to 11e, a controller chip 33 and nonvolatile memory chips 34a, 34b via wiring patterns and electrically conducting patterns. In FIG. 5, reference numeral 36 denotes electrically conducting patterns connected to the corresponding connection terminals 3a to 3g via the through holes 40, and reference numeral 35 denotes a wiring pattern for connecting the ends of the varistors 11a to 11e to the ground voltage Vss. The varistors 11a to 11e are surface-mounted spanning across the wiring pattern 35 and the connection terminals 3a to 3e.

In FIG. 5, reference numerals 38 and 39 denote bonding patterns, and 37 denotes wiring patterns connecting the bonding patterns 38 to the electrically conducting patterns 36. The electrically conducting patterns 38 are connected to the corresponding external terminals 50 of the controller chip 33 through bonding wires 41, and the external terminals 51 of the controller chip 33 are connected to the corresponding bonding patterns 39 through bonding wires 42. The bonding patterns 39 are connected to the corresponding external terminals 52a of one nonvolatile memory chip 34a by bonding wires 43a, and the bonding patterns 39 are connected to the corresponding external terminals 52b of the other nonvolatile memory chip 34b by bonding wires 43b. The semiconductor integrated circuit chip is a so-called bear chip, and the external terminals 50, 51, 52a and 52b are the bonding pads formed of aluminum, aluminum alloy, copper or the like.

The nonvolatile memory chips 34a and 34b are, for example, electrically rewritable flush memory chips. The flush memory chip has a memory cell array in which are arranged, like a matrix, nonvolatile memory cell transistors having a control gate, a floating gate, a source and a drain, and executes such operations as reading the data, erasing the data, writing the data and verifying the data according to commands and addresses fed from an external unit. The nonvolatile memory chips 34a and 34b comprising the flush memory chips have external terminals 52a and 52b, which are terminals for receiving a chip enable signal (also called chip selection signal) /CE for instructing the selection of chip, terminals for receiving a write enable signal /WE for instructing the writing operation, input/output terminals I/O0 to I/O7, terminals for receiving a command/data enable signal /CDE for instructing whether the input/output terminals I/O0 to I/O7 be used for inputting/outputting the command/data or for receiving the address, terminals for receiving an output enable signal /OE for instructing the output operation, terminals for receiving a clock signal /SC for instructing the data latch timing, a terminal for outputting a ready/busy signal R/B for instructing to an external unit whether the writing operation is being executed, and terminals for receiving a reset signal /RES.

The controller chip 33 has a privacy protection function which controls the reading/writing operation for the nonvolatile memory chips 34a, 34b according to an instruction from an external unit, executes the encryption for the data to be written into the nonvolatile memory chips 34a, 34b by taking into consideration the data security or the copyright protection, and executes the decryption for the data read out from the nonvolatile memory chips 34a and 34b.

The external terminals 50 of the controller chip 33 are corresponded to the input/output functions of the connection terminals 3a to 3g, and include a terminal for receiving a select signal CS for instructing the selection operation of the multi-media card, a terminal for serially receiving the command CMD for instructing the operation of the multi-media card, a terminal for receiving a clock signal CLK that is regarded to be in synchronism with the signal input/output operation of the external terminal 50, a terminal for serially inputting/outputting the data DAT, and a terminal for receiving a power source voltage Vcc and ground voltage Vss. In the controller chip 33 are integrated the input protection circuit 6 and clamping MOS transistors Q6 and Q7 that are described with reference to FIG. 1 concerning the input terminals that are among the external terminals 50.

The controller chip 33 has external terminals 51 for making access to the memories, i.e., a terminal for sending a chip selection signal /CE0 to the nonvolatile memory chip 34a, a terminal for sending a chip selection signal /CE1 to the nonvolatile memory chip 34b, and external terminals corresponding to the external terminals of the nonvolatile memory chips 34a and 34b but having an input/output direction opposite thereto.

<Connection of the Bonding Wires>

As described above, bonding wires 41 are used for connecting the connection terminals 3a to 3g to the external terminals 50 of the controller chip 33, and bonding wires 43a and 43b are used for connecting the controller chip 33 to the nonvolatile memory chips 34a, 34b. This eliminates the need of forming a number of wiring patterns having the same function as the connection by the above bonding wires in a concentrated manner on the card substrate 1. Space on the controller chip 33 and on the nonvolatile memory chips 34a, 34b can be utilized for the wiring. In effect, the aerial wiring of the bonding wires makes it possible to simplify the wiring on the substrate. Therefore, this contributes to decreasing the cost of the card substrate 1.

<Stacked Mounting in a Deviated Manner>

Figure 2:
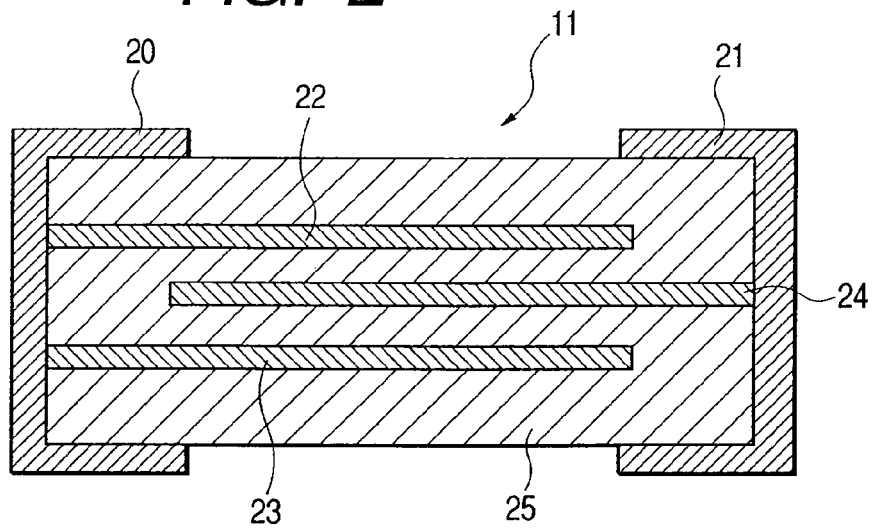
FIG. 2 is an axial sectional view illustrating the structure of a varistor in cross section.

In the constitution of FIG. 2, the two nonvolatile memory chips 34a and 34b are connected using the bonding wires in parallel with the controller chip 33. Here, the nonvolatile memory chips 34a and 34b are mounted on the card substrate 1 in a state of being stacked one upon the other with their positions being so deviated that the external terminals 52a, 52b are exposed. Therefore, the distances to the controller chip 33 can be shortened compared to when the nonvolatile memory chips 34a, 34b are arranged without being stacked, and the lengths of the bonding wires 43a, 43b can be shortened. This decreases undesired contact or breakage of the bonding wires. When plural nonvolatile memory chips are stacked, the amount of deviation may be determined within such a range that a chip of the lower layer exits under the external terminals for bonding of the chip of the upper layer. When the chip of the lower layer is not existing under the external terminals for bonding, the chip is likely to be damaged due to mechanical force at the time of bonding.

At this moment, in particular, a condition is satisfied in that the area on one surface of the card substrate 1 is larger than the total areas of the nonvolatile memory chips 34a, 34b and the controller chip 33. This is a contrivance for providing the card substrate 1 with an extra space to cope with such a restrictive condition that the wiring layer is formed on one surface only of the card substrate. This is different from a simple idea of mounting the nonvolatile memory chips in a stacked manner to decrease the area of the card substrate 1.

<Column-like Layout>

In the example of FIG. 5, the nonvolatile memory chips 34a, 34b and the controller chip 33 are mounted on the card substrate 1 being arranged like columns. That is, the distance from the connection terminals 3a to 3g of the multi-media card is increased in order of the varistors 11a to 11e, the controller chip 33 and the plural memory chips 34a, 34b, and they are arranged like columns from one side of the card substrate 1 toward the opposing side thereof. Owing to this column-like arrangement, the second varistors 11a to 11e for finally releasing the overvoltage are closest to the connection terminals 3a to 3g to which the overvoltage will be applied, and the nonvolatile memory chips 34a, 34b storing the data are the remotest, producing the effect for absorbing the surge of high-speed pulses. Therefore, a high reliability is obtained in regard to reinforcing the prevention of electrostatic damage to the controller chip 33 owing to the varistors 11a to 11e, and to protecting the data stored in the nonvolatile memory chips 34a and 34b.

<Deviation of Through Holes from the Connection Terminals>

Figure 7A:
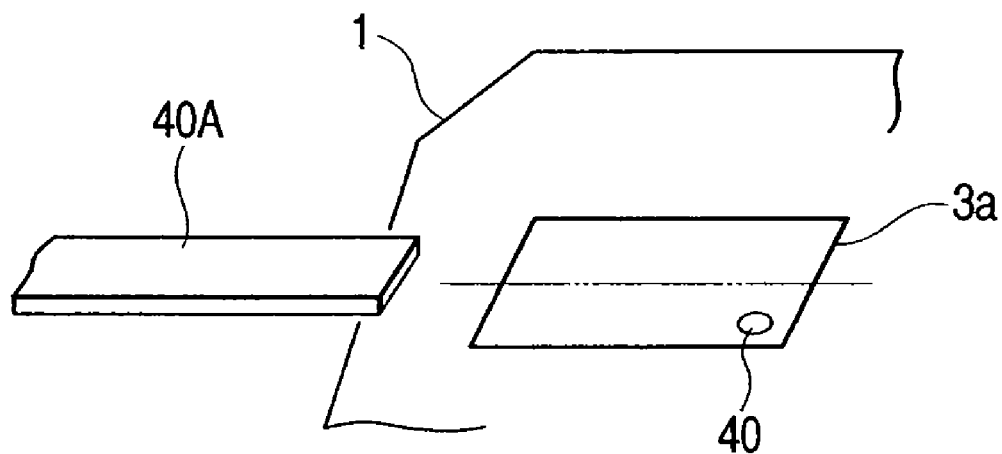
FIG. 7 is a diagram illustrating a state where a through hole is formed in a deviated manner in a connection terminal of the multi-media card.
Figure 7B:
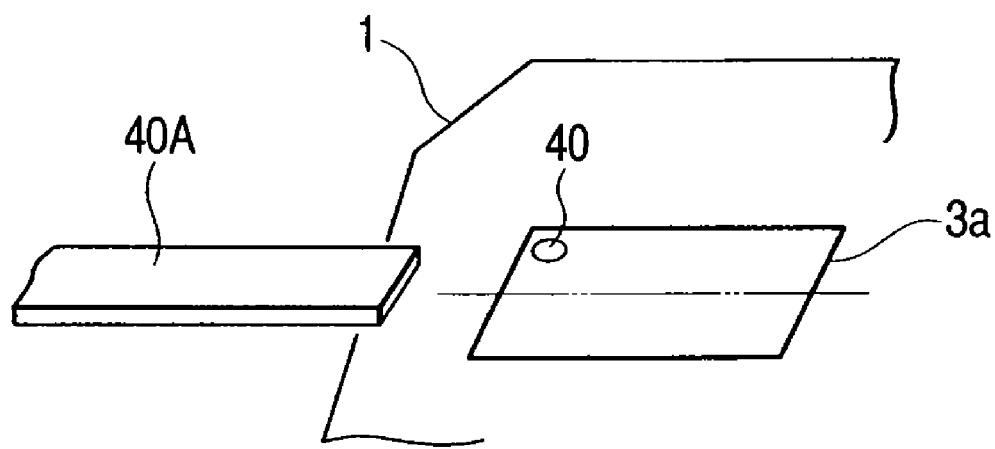

As shown in FIG. 5, the through holes 40 are formed at deviated positions in the connection terminals 3a to 3g. That is, as shown in detail in FIG. 7(A), the through hole 40 is formed in the connection terminal 3a exposed from the IC card at a position deviated from the slide surface of the connection terminal 3a. The position of deviation may be as shown in FIG. 7(B). Then, even when the IC card is attached to, or detached from, the mounting slot, the terminal 40A of the slot does not come into slide contact with the through hole 40 and does not exert a mechanical force to the through hole 40. This prevents a probability in that the pattern of the connection terminal 3a is cracked starting from the through hole 40, or the periphery of the through hole is worn out causing a damage thereto.

<Formation of Through Holes Outside the Molding Region>

Referring to FIG. 6, the controller chip 33 and the nonvolatile memory chips 34a, 34b as a whole are molded with a thermosetting resin 55. The varistor element may be provided inside the mold or outside the mold. Here, no through hole 40 is included in the region molded with the thermosetting resin 55. This precludes such a probability that the molding resin 55 flows to the back side of the card substrate 1 through the holes 40 to cause defective molding when the molding is effected with the application of pressure.

<Metal Cap>

In FIG. 6, a metal cap 56 is covering the surface of the card substrate 1 on where there are mounted varistors 11a to 11e, controller chip 33 and nonvolatile memory chips 34a, 34b outside the mold. This provides a countermeasure against EMI (electro magnetic interference) as compared with the resin cap, accomplishing the sealing by mechanical fastening or the sealing of cap at a high temperature.

FIG. 25 illustrates several kinds of structures of the metal caps 56. FIG. 25(A) illustrates a metal cap formed by forging piece by piece in an isolated manner and having a small step for sticking a label, FIG. 25(B) illustrates a metal cap formed by forging followed by blanking piece by piece in an isolated manner, and FIG. 25(C) illustrates a metal cap formed by reducing a metal plate. FIG. 25(D) is a perspective view of when the metal cap obtained by reducing the metal plate of FIG. 25(C) is viewed from the back side. Corner portions have been cut way in advance to avoid wrinkles at the time of reduction.

<Stitch Bonding>

Figure 8:
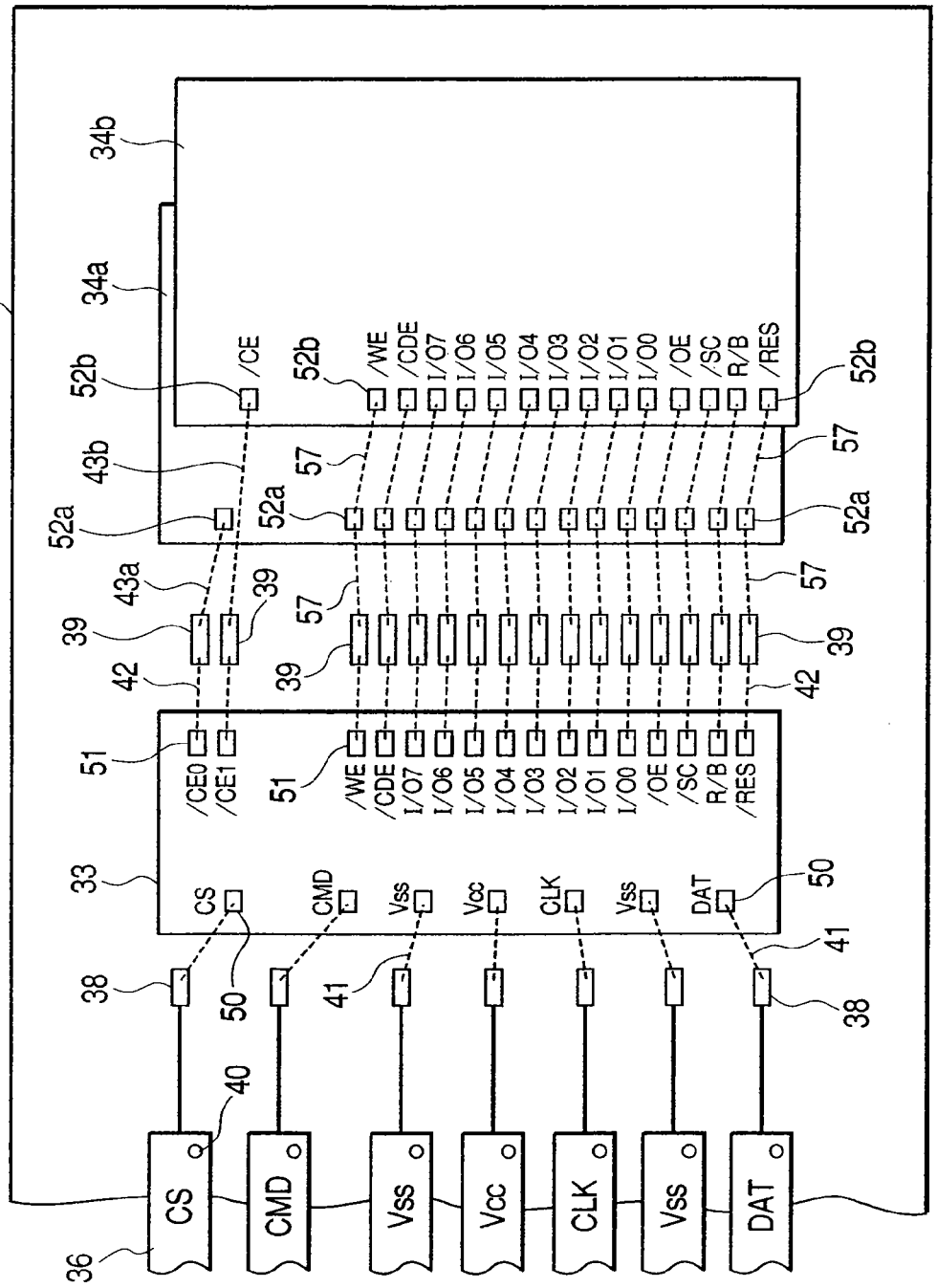
FIG. 8 is a plan view partly illustrating the multi-media card by applying stitch bonding for connecting the nonvolatile memory chips.
Figure 9:
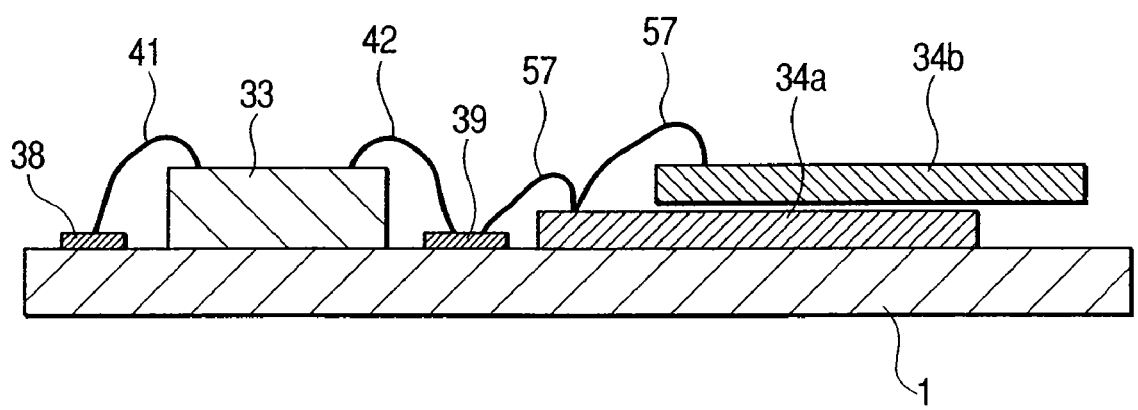
FIG. 9 is a vertical sectional view of a stitch-bonded portion.

FIG. 8 illustrates a portion of the multi-media card in which the nonvolatile memory chips are connected by stitch bonding. FIG. 9 is a vertical sectional view illustrating the stitch-bonded portions. Like in FIG. 5, the nonvolatile memory chips 34a and 34b are mounted on the card substrate 1 in a manner of being stacked in a plural number but with their positions being so deviated that their external terminals 52a, 52b are exposed. Here, the external terminals 52a, 52b of the nonvolatile memory chips that receive the same signals from the controller chip 33 are successively connected in series with the bonding wires 57. Thus, there is employed a bonding method like a so-called stitch-sewing, i.e., a stitch-bonding method. The bonding wires can be shortened as a whole compared to the case of connecting the controller chip 33 to the external terminals 52a, 52b using separate bonding wires 43a, 43b as is done in FIG. 5. Besides, the number of the bonding wires can be decreased in the region of bonding patterns. In this respect, too, it is allowed to decrease the probability of undesired contact or breakage of the contact wires that occurs when they are arranged too densely. The nonvolatile memory chips 34a, 34b must be selected separately. The stitch-bonding cannot be employed for the bonding wires 43a, 43b for transmitting the chip selection signals /CE0, /CE1; i.e., the wires 43a, 43b are bonded in the same manner as in FIG. 5.

When the stitch-bonding is employed, the method of bonding the bonding pads 52a may differ depending upon the form of bonding by a wire bonder that is used. FIG.

Figure 10A:
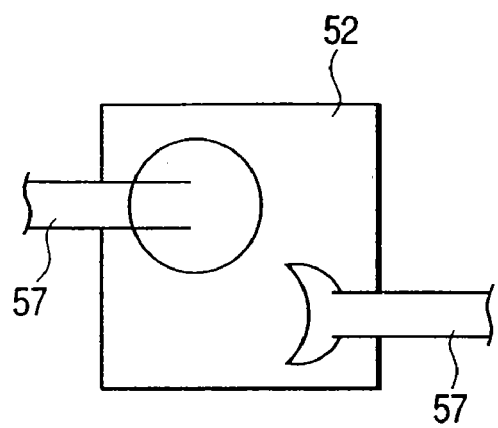
FIG. 10 is a diagram illustrating the wire bondings of when a nail head bonding is utilized and when a wedge bonding is utilized.
Figure 10B:
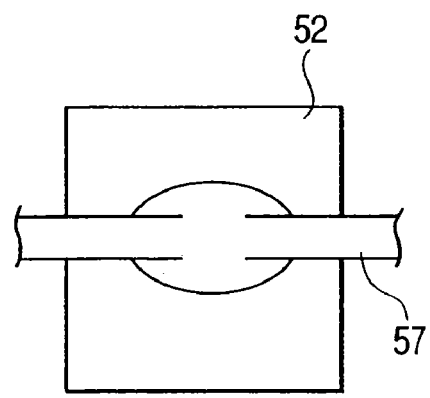

10(A) illustrates the case of when the nail head bonding is utilized. In this case, due to the structure of the wire bonder, the end of the bonding wire is torn away like a crescent. Therefore, the next bonding point must be another place from the end point. Namely, the stitch bonding is completed with bonding wires 57, 57 that are inevitably cut into plural pieces. FIG. 10(B), on the other hand, illustrates a case of utilizing the wedge bonding. By using a wire bonder which supports this method, the bonding can be successively effected to the subsequent positions without cutting the bonding wire. According to this system, therefore, the stitch-bonding can be effected by using a single bonding wire 57.

Figure 11:
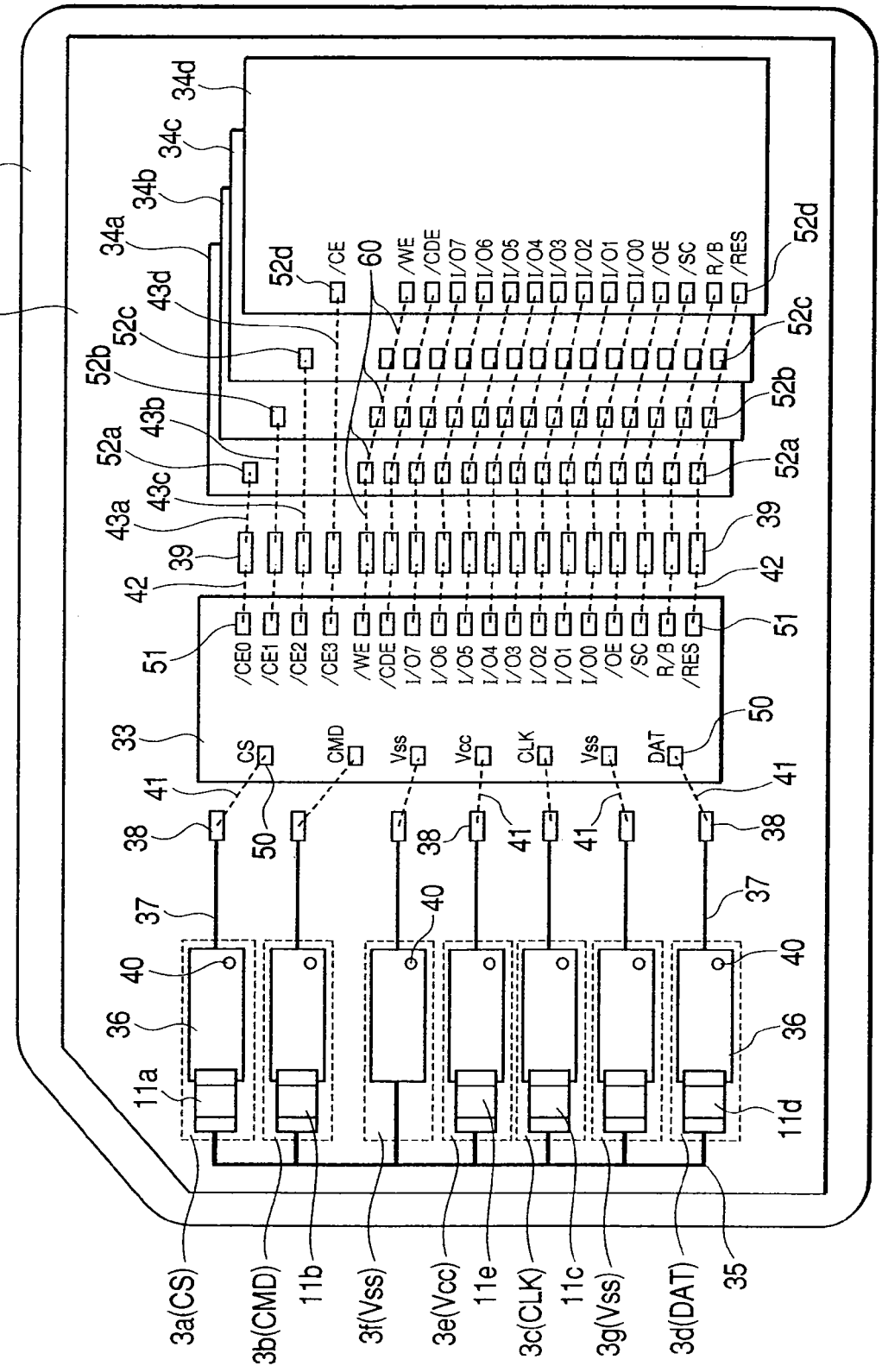
FIG. 11 is a diagram illustrating, on a plane, the constitution of a multi-media card having a structure in which four pieces of nonvolatile memory chips are stacked.
Figure 12:
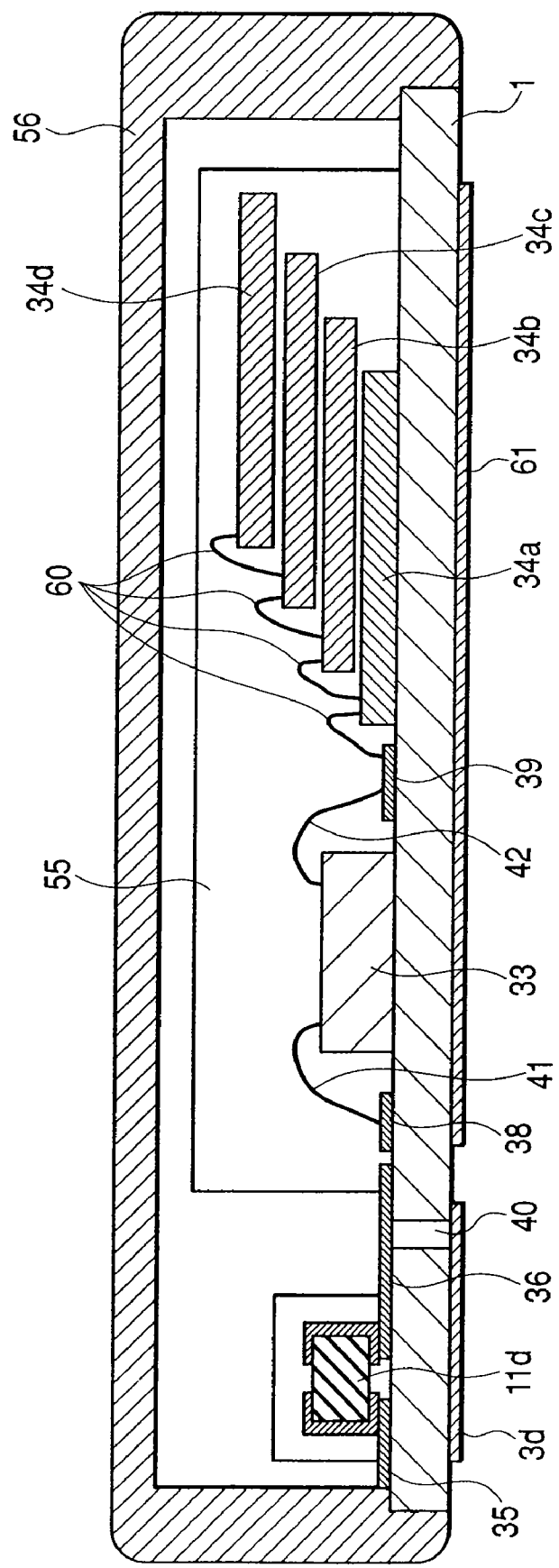
FIG. 12 is a vertical sectional view illustrating the sectional structure of the multi-media card of FIG. 11.

FIG. 11 illustrates on a plane the constitution of the multi-media card having a structure in which four pieces of nonvolatile memory chips are stacked. FIG. 12 is a vertical sectional view thereof. The four pieces of nonvolatile memory chips 34a to 34d are mounted on the card substrate 1 being stacked with their positions being so deviated that the external terminals 52a to 52d are exposed. Here, the external terminals 52a to 52d of the nonvolatile memory chips 34a to 34d that receive the same signals from the controller chip 33 are successively connected in series using the bonding wires 60 like the stitch-bonding. The nonvolatile memory chips 34a to 34d must be separately selected. Therefore, the stitch-bonding is not employed for the bonding wires 43a to 43d for transmitting the chip selection signals /CE0 to /CE3; i.e., the wires 43a to 43d are bonded in the same manner as in FIG. 5. However, the stitch-bonding can be effected if the chip selection signal is generated in the form of an ID command.

<Shielding Pattern>

The constitution of FIG. 11 employs an electrically conducting shielding pattern 61 shown in FIG. 12 for the card substrate 1 in order to further relax the effect of electrostatic discharge taking place near the card substrate. That is, the wide electrically conducting shielding pattern 61 is formed on the exposed surfaces of the connection terminals 3a to 3g of the card substrate 1. Though there is no particular limitation, the electrically conducting shielding pattern 61 may be connected to the connection terminals 3f, 3g for supplying ground power source Vss, or may be floated since it has a relatively large surface area. The electrically conducting shielding pattern 61 disperses the static electricity.

<CS Input Terminal at an End of the Chip>

In the structure in which the plural nonvolatile memory chips 34a to 34d are stacked being deviated as shown in FIG. 11, the terminals for receiving the chip selection signals /CE0 to /CE3 among the external terminals 52a to 52d of the nonvolatile memory chips 34a to 34d, are located at the ends of the arrangements of the external terminals, and are separately connected to the external terminals 51 of the controller chip 33 through the bonding wires 43a to 43d. Quite the same holds even for the stacked structure of FIG. 8. In the constitution in which the plural nonvolatile memory chips are separately selected as shown in FIGS. 8 and 11, the terminals for receiving the chip selection signal among the external terminals of the nonvolatile memory chips must be separately connected to the external terminals 51 for producing a chip selection signal of the controller chip 33. Even if the stitch-bonding method cannot be adapted to these portions, therefore, a necessary connection can be accomplished without hindered by other bonding wires since the external terminals for receiving the chip selection signal have been disposed at the ends of the nonvolatile memory chips. The effect appears conspicuously as the number of the nonvolatile memory chips that are stacked increases. When two pieces of nonvolatile memory chips are stacked as shown in FIG. 5, two bonding wires can be easily drawn in parallel from a single bonding pattern by using a wire bonder having a high degree of precision. In this case, too, no inconvenience occurs even when the external terminal for receiving the chip selection signal is disposed at an end of the chip though the stitch-bonding is not employed.

<Mounting the Stacked Nonvolatile Memory Chips in Plural Groups>

Figure 13:
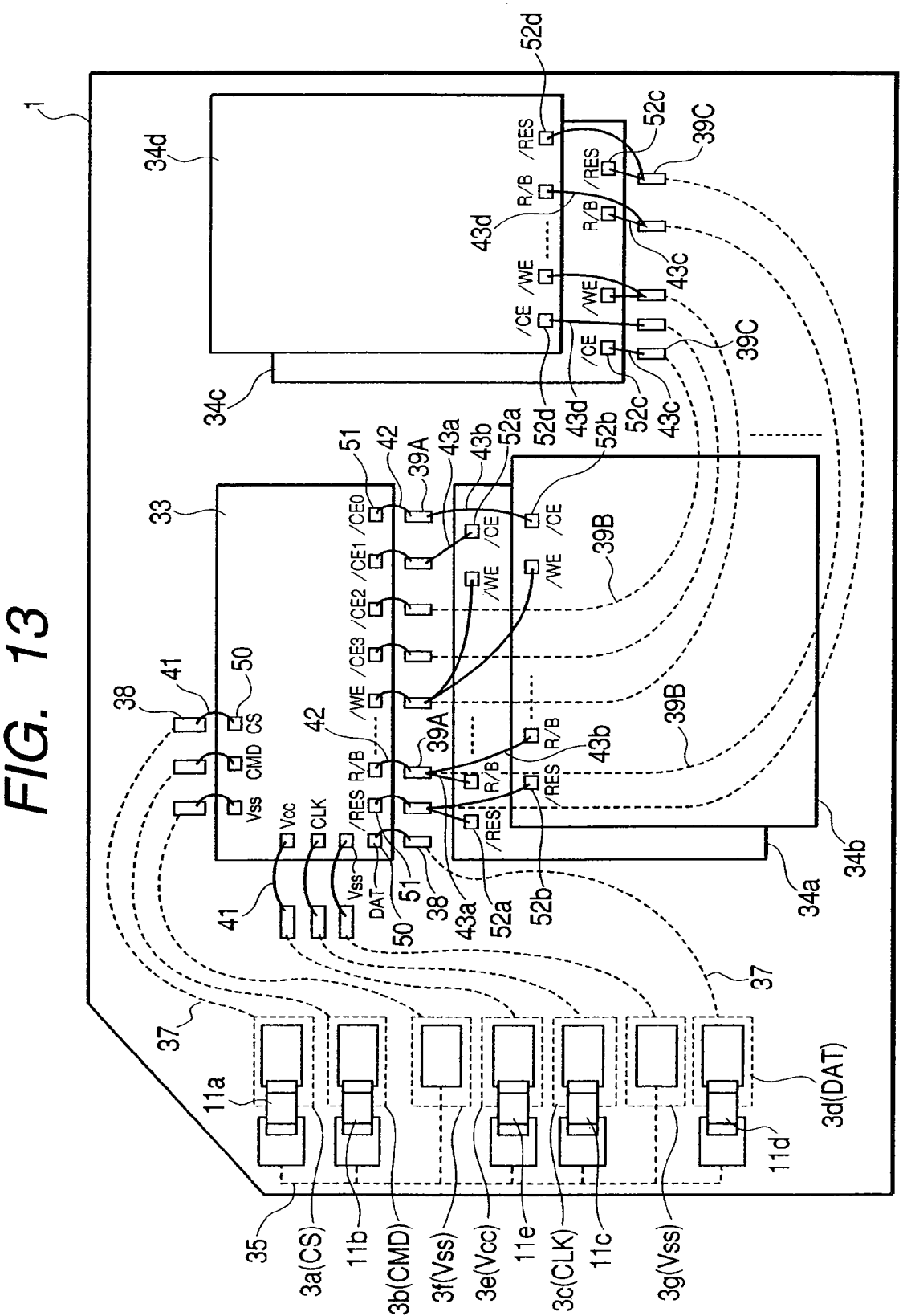
FIG. 13 is a plan view illustrating a multi-media card applying a structure for stacking the memory chips in a divided manner and a structure in which the connection terminals and the controller chip are arranged along the two neighboring sides of the card substrate.
Figure 14:
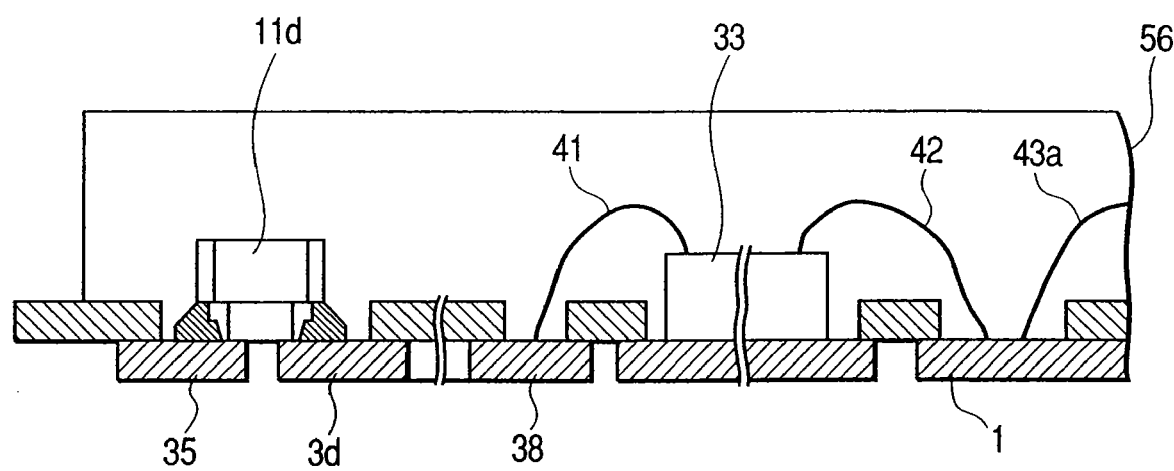
FIG. 14 is a vertical sectional view illustrating a portion of the multi-media card of FIG. 13.

FIG. 13 is a view illustrating another example of the multi-media card, and FIG. 14 is a vertical sectional view illustrating a portion thereof. In the multi-media card shown in FIG. 13, two sets of nonvolatile memory chips are mounted on the card substrate 1, each set comprising two pieces of nonvolatile memory chips that are stacked, and a single-phase wiring is formed on one surface only of the card substrate 1, the single-phase wiring including wiring patterns and bonding patterns together with the connection terminals. This is the so-called COB (chip-on-board) structure mounting a semiconductor bear chip on the substrate.

In FIG. 13, the connection terminals 3a to 3g, wiring patterns 35, 37, bonding pattern 38, bonding patterns 39A, 39C, and wiring pattern 39B are all formed on the mounting side of the card substrate 1. The connection terminals 3a to 3g and the wiring pattern 35 are exposed on the surface through openings formed in the card substrate 1, enabling the varistors 11a to 11e to be connected. Similarly, the bonding patterns 38, 39A and 39C are exposed on the surface through openings formed in the card substrate 1, so as to be bonded to the external terminals 50, 51 of the controller chip 33 and to the external terminals 52a to 52d of the nonvolatile memory chips 34a to 34d. In FIG. 13, the stitch-bonding is employed to neither the bonding between the bonding pattern 39A and the external terminals 52a, 52b of the nonvolatile memory chips 34a, 34b nor to the bonding between the bonding pattern 39C and the external terminals 52c, 52d of the nonvolatile memory chips 34c, 34d. However, the stitch-bonding same as that of FIG. 8 may be employed except for the chip selection signals.

When two sets of the nonvolatile memory chips are mounted on the card substrate 1, each set comprising two pieces of nonvolatile memory chips that are stacked as shown in FIG. 13, the thickness can be decreased compared to when four pieces are stacked as in FIG. 11. Therefore, when two sets of the nonvolatile memory chips are mounted on the card substrate 1, each set comprising four pieces of nonvolatile memory chips that are stacked, then, the storage capacity of two folds as great can be obtained with the same height as that of the four-piece-stacked structure of FIG. 11.

When plural connection terminals 3a to 3g are arranged along a side of the card substrate 1, the card controller 33 may be arranged with its lengthwise direction in parallel with the neighboring side and the nonvolatile memory chip may be arranged in a direction nearly at right angles with the direction of arrangement of the connection terminals 3a to 3g. Then, the nonvolatile memory chips can be efficiently mounted on the surface of the card substrate 1.

The divisional stacked structure and the structure for arranging the connection terminals 3a to 3g and the controller chip 33 along the two sides of the card substrate 1, make it easy to mount the nonvolatile memory chips on the card substrate of a specified size maintaining an increased density or to mount the nonvolatile memory chips in a increased number.

Figure 15:
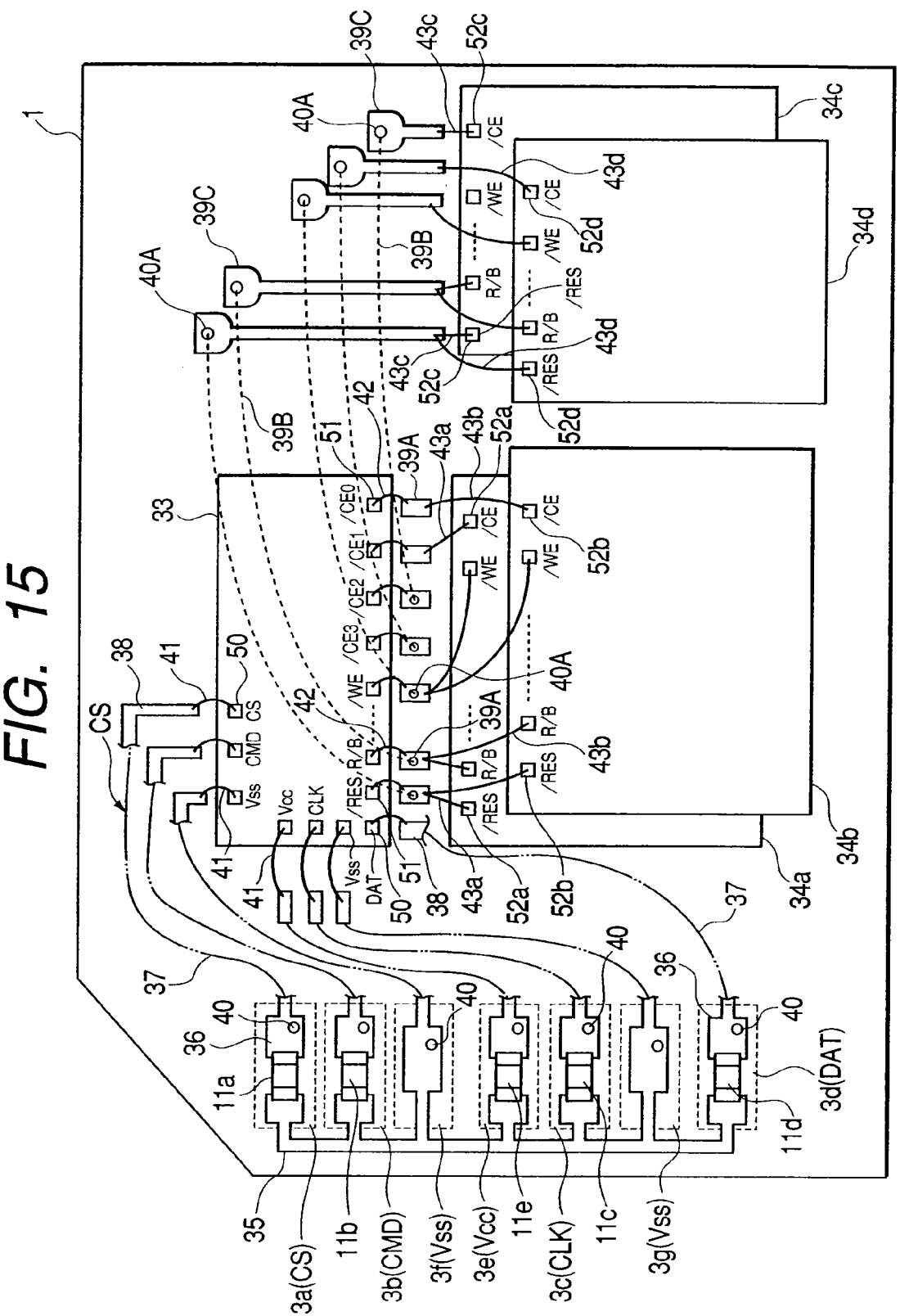
FIG. 15 is a plan view illustrating another multi-media card applying a structure for stacking the memory chips in a divided manner and a structure in which the connection terminals and the controller chip are arranged along the two neighboring sides of the card substrate.

FIG. 15 illustrates a further multi-media card employing the above divisional stacked structure and a structure in which the connection terminals and the controller chip are arranged along the two neighboring sides of the card substrate. This example is different from that of FIG. 13 in regard to that the connection terminals, wiring patterns and bonding patterns are formed on both surfaces of the card substrate 1 and that the directions of the stacked nonvolatile memory chips are oriented.

In FIG. 15, the connection terminals 3a to 3g and the wiring patterns 39B are formed on the back surface of the card substrate, and the wiring patterns 35, 37, bonding pattern 38, and bonding patterns 39A, 39C are formed on the surface of the card substrate 1. Through holes 40A are used for connecting the wiring pattern 39B to the bonding patterns 39A, 39C. Like in FIG. 13, FIG. 15 does not employ the stitch bonding, either. However, the stitch bonding like that of FIG. 8 may be employed except for the chip selection signals.

Like that of FIG. 13, the divisional stacked structure and the structure for arranging the connection terminals 3a to 3g and the controller chip 33 along the two sides of the card substrate 1 in the multi-media card of FIG. 15, make it easy to mount the nonvolatile memory chips on the card substrate of a specified size maintaining an increased density or to mount the nonvolatile memory chips in an increased number.

Here, the through holes in the mold may be filled with an electrically conducting paste or a solder resist to prevent the leakage of the molding resin.

<Structure for Stacking the Memory Chips and the Controller Chip>

Figure 16:
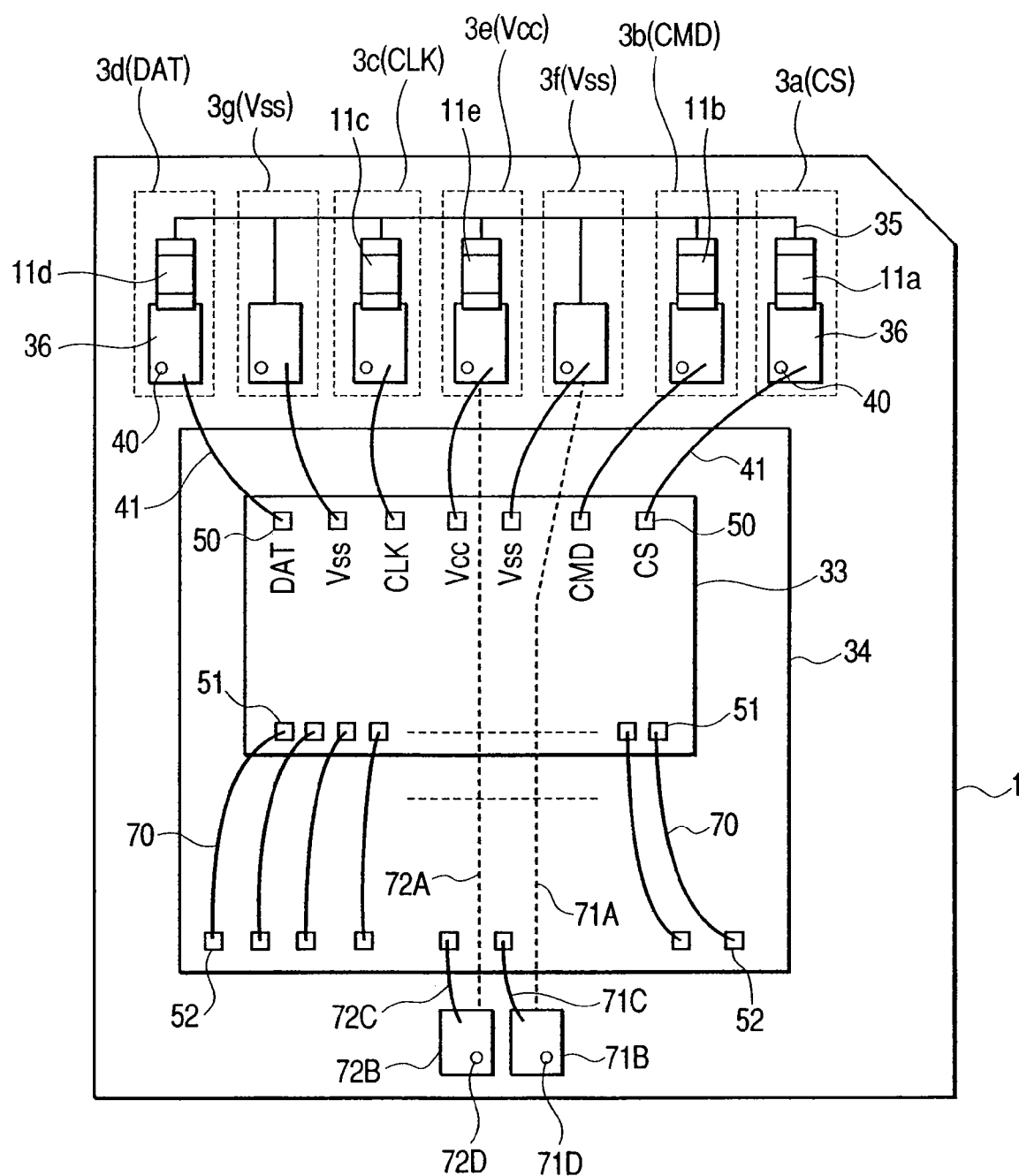
FIG. 16 is a plan view illustrating a memory card in which the controller chip is placed on the memory chip to stack both of them.
Figure 17:
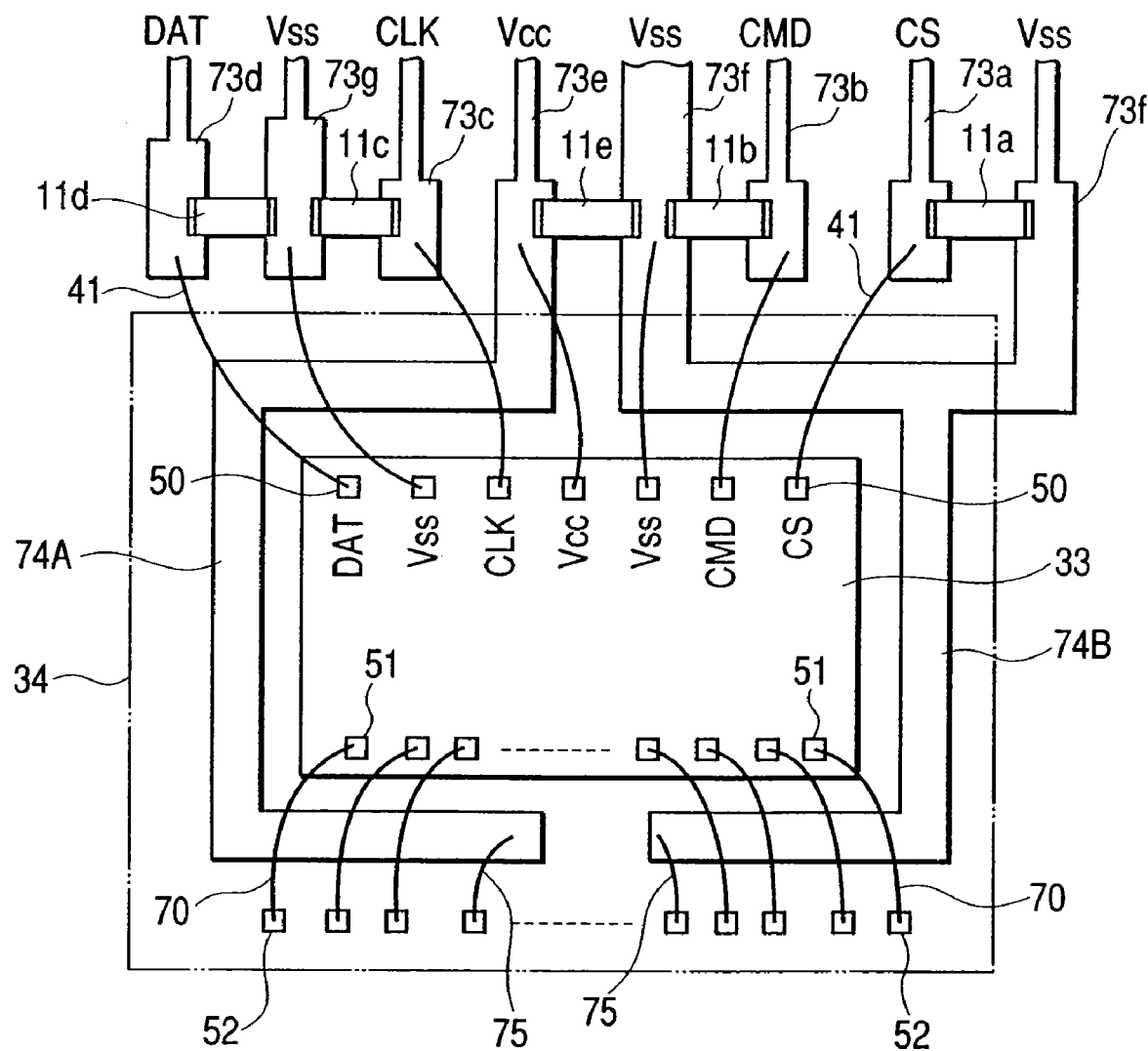
FIG. 17 is a plan view illustrating a folded card by stacking the memory chips and the controller chip by utilizing LOC.

FIGS. 16 and 17 illustrate examples in which the controller chip is mounted and stacked on the memory chip. In FIG. 16, the external terminals 51 of the controller chip 33 are connected to the external terminals 52 of the nonvolatile memory chip 34 based on the direct interchip bonding by using the bonding wires 70. In order to decrease the resistance for feeding the operation power sources Vss, Vcc to the nonvolatile memory chip 34, however, power source wiring patterns 71A, 72A are formed on the back surface of the card substrate 1, and the bonding patterns 71B, 72B connected through the holes 71D, 72D are connected to the nonvolatile memory chip 34 through the bonding wires 71C, 72C. When the resistance for feeding the power to the nonvolatile memory chip 34 is very small, however, the power sources Vcc, Vss may be fed through the terminals 51 and 52. The structure for mounting the varistors 11a to 11e is the same as the one described above, and the circuit elements having the same functions as those of FIG. 15 are denoted by the same reference numerals but their description is not repeated.

FIG. 17 illustrates a structure in which the memory chip and the controller chip are stacked by utilizing an LOC (lead-on-chip). Reference numerals 73a to 73g denote some of the leads of a lead frame for the LOC. The leads 73e and 73f for the power sources Vcc, Vss are extending like hooks and are forming path bars 74A and 74B. The nonvolatile memory chip 34 is secured to the path bars 74A, 74B, and the controller chip 33 is secured to the nonvolatile memory chip 34. The external terminals 50 of the controller chip 33 are connected to the leads 73a to 73g through the bonding wires 4. Further, the external terminals 51 of the controller chip 33 are connected to the external terminals 52 of the nonvolatile memory chip 34 by the direct interchip bonding method using the bonding wires 70. In order to decrease the resistance for feeding the operation power sources Vss, Vcc to the nonvolatile memory chip 34, however, the path bars 74A and 74B are connected to the nonvolatile memory chip 34 through the bonding wires 75, 75. The varistors 11a to 11e are surface-mounted on the corresponding leads using an electrically conducting paste such as Ag paste.

Figure 18:
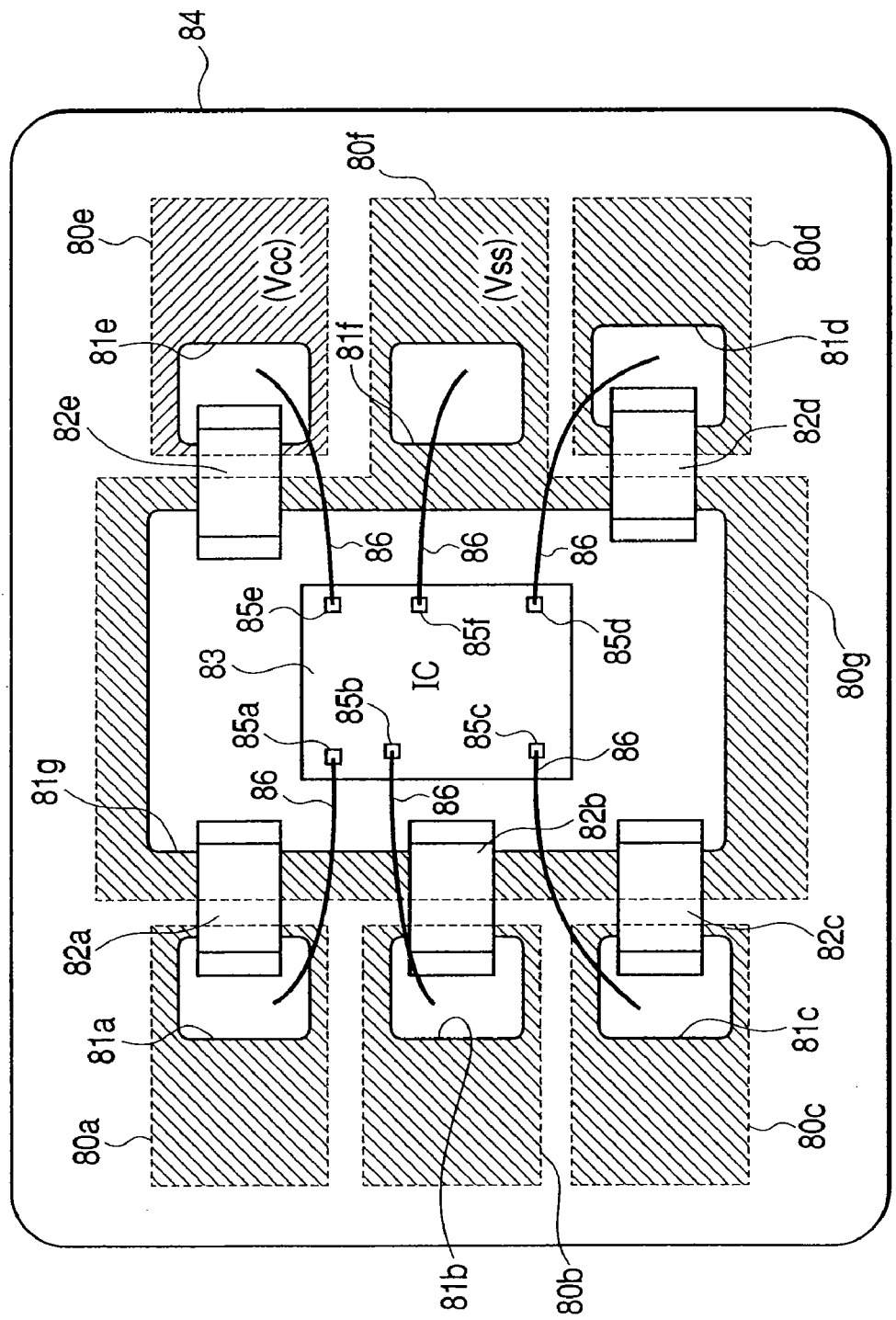
FIG. 18 is a plan view illustrating another IC card applying a COB structure.
Figure 19:
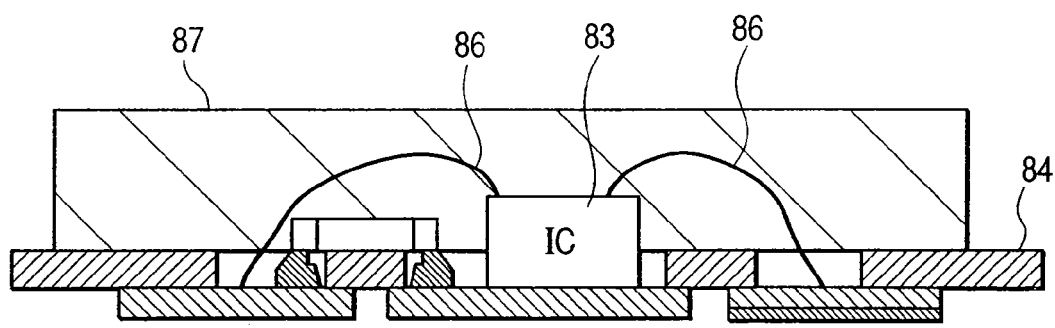
FIG. 19 is a vertical sectional view of the IC card of FIG. 18.
Figure 20:
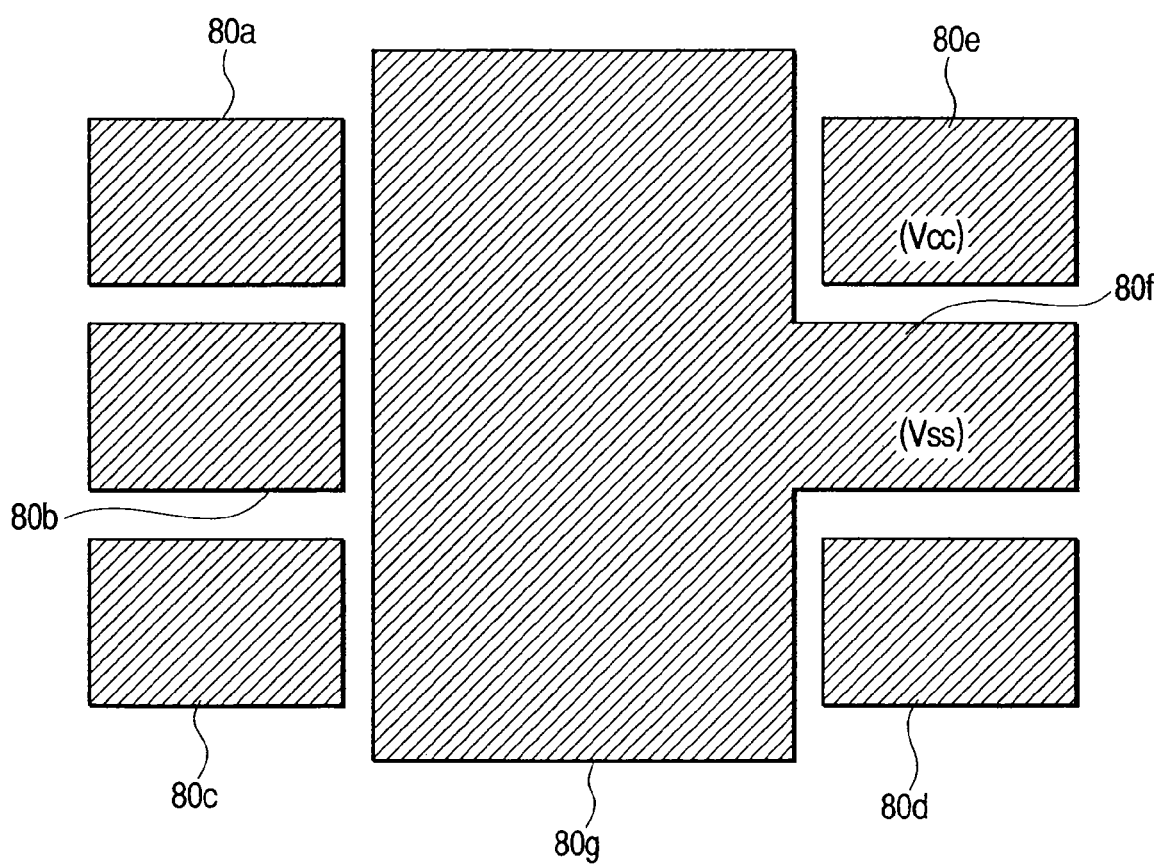
FIG. 20 is a view illustrating an electrically conducting pattern formed on the bottom surface of a card substrate of the IC card of FIG. 18.

FIG. 18 illustrates a still further IC card employing the COB structure. FIG. 19 is a vertical sectional view of the IC card, and FIG. 20 is a view illustrating the electrically conducting pattern formed on the bottom surface of the card substrate of the IC card of FIG. 18. Electrically conducting patterns 80a to 80g are formed on the bottom surface of the card substrate 84, and openings 81a to 81g are formed in the card substrate 84 being corresponded thereto. The electrically conducting patterns 80a to 80f constitute connection terminals exposed from the IC card. The semiconductor integrated circuit chip 83 is connected to the electrically conducting pattern 80f via the opening 81g and is served with ground voltage Vss as a substrate potential. Bonding pads 85a to 85f constituting the external terminals of the semiconductor integrated circuit chip 83 are connected to the connection electrodes 80a to 80f using the bonding wires 86 through the openings 81a to 81f. Then, varistors 82a to 82e comprising chiefly semiconductor ceramics are surface-mounted across the connection terminals 80a to 80g and the electrically conducting patterns 80g through the openings 81a to 81g using an electrically conducting paste such as Ag paste in order to reinforce the prevention of electrostatic damage to the semiconductor integrated circuit chip 83 in the same manner as described above.

<Notice>

Figure 21A:
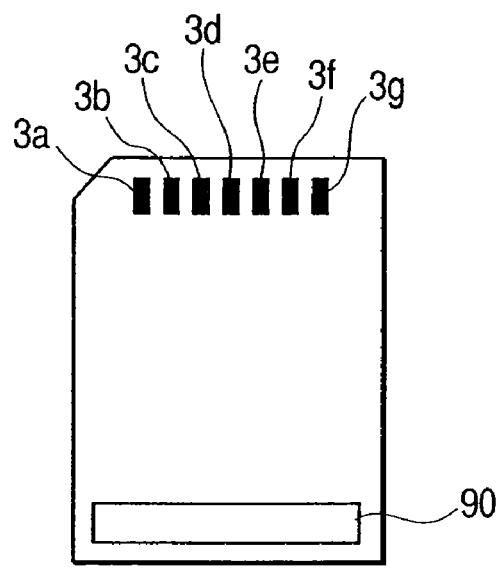
FIG. 21 is a view illustrating an IC card describing a notice or a sign of caution for preventing electrostatic damage.
Figure 21B:
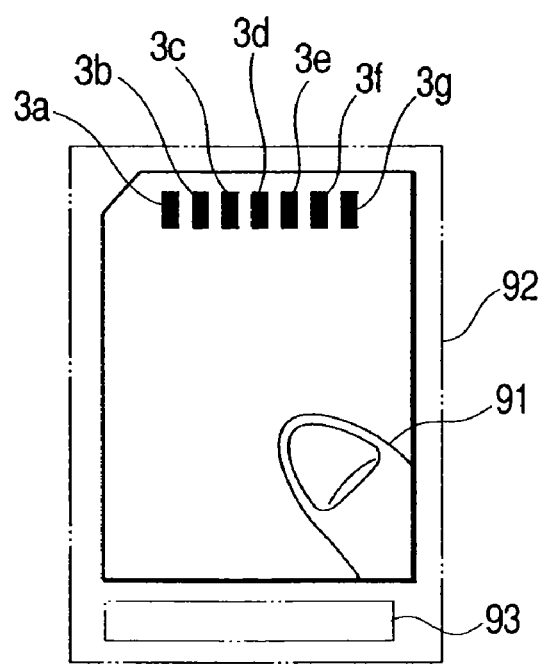

FIG. 21 illustrates an IC card having a notice for preventing the electrostatic damage. An IC card such as the multimedia card mounting the semiconductor integrated circuit chip with plural connection terminals being exposed, is provided on its surface with a notice 90, such as "DON'T TOUCH THE CONNECTION TERMINALS" as shown in FIG. 21(A) so that the user will not touch the connection terminals 3a to 3g. On this region may further be written a production management code. As shown in FIG. 21(B), further, an indication is provided to clearly indicate the position for holding the IC card by fingers, such as notice indication 91 in the form of a finger printed on a position where the IC card should be held by fingers at the time of attachment or detachment. As shown in FIG. 21(B), further, a packing material 92 such as a laminated film, a paper box or a plastic casing packing the IC card may be provided with a notice 93 warning not to touch the connection terminals 3a to 3g of the IC card.

The notices 90, 93 and indication 91 are helpful for preventing the IC card from being electrostatically damaged due to unexpected handling by a person who is not familiar with the IC card.

<How to Fabricate the IC Card>

Figure 22:
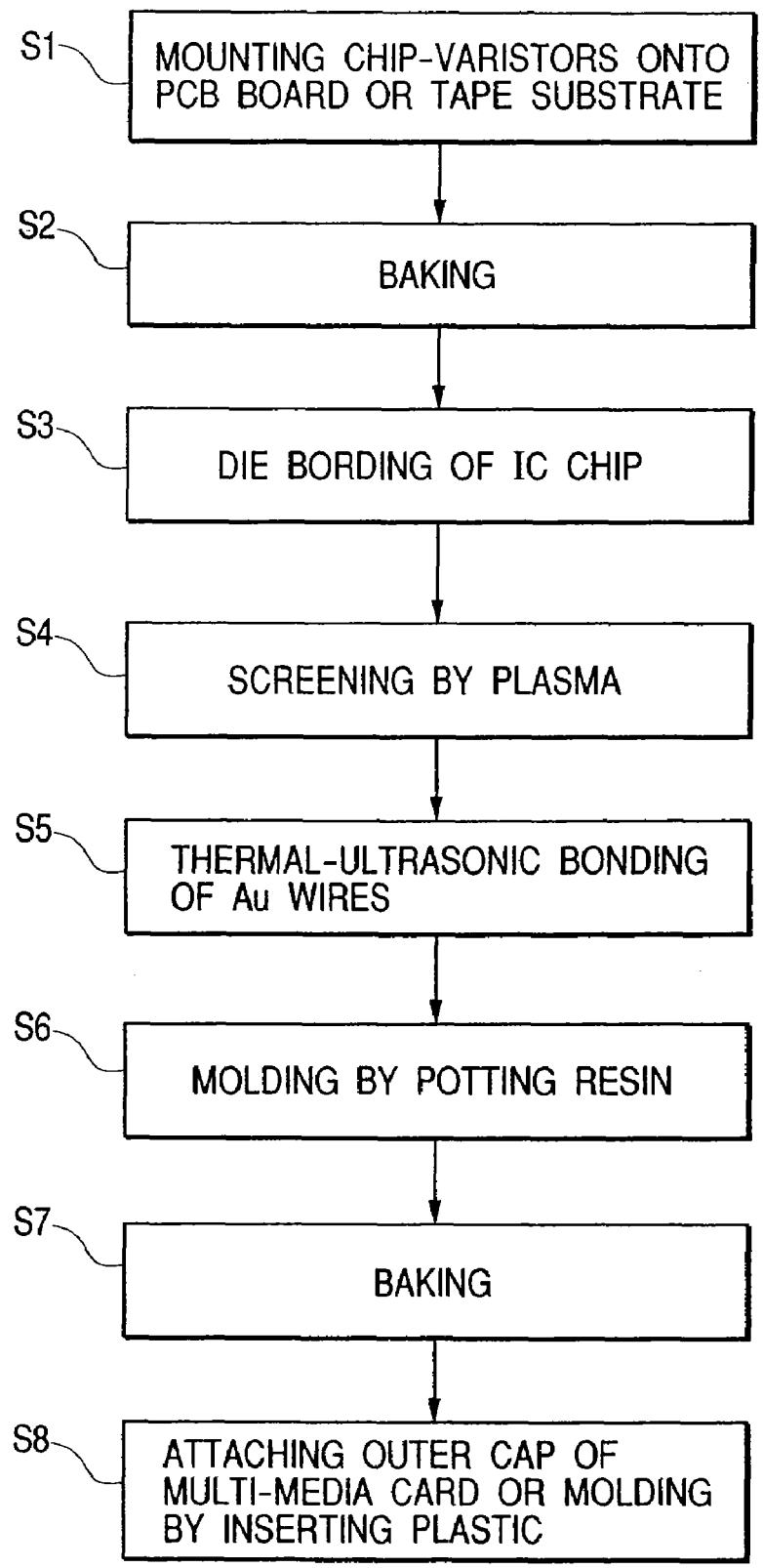
FIG. 22 is a flowchart illustrating a method of fabricating an IC card mounting varistors.

FIG. 22 illustrates a method of fabricating the IC card shown in FIGS. 4 and 5. First, varistors are mounted on the predetermined electrically conducting patterns of the card substrate such as a PCB substrate or a tape substrate (S1) In practice, a solder paste or a silver paste is used. Thereafter, the paste is cured (baked) (S2), and a required number of the semiconductor integrated circuit chips are die-bonded to the electrically conducting pattern on the card substrate (S3). Then, the surface of the card substrate is cleaned with a plasma (S4). Then, the bonding pads of the semiconductor integrated circuit chips that are die-bonded are bonded to the electrically conducting pattern by thermal ultrasonic method using gold bonding wires (S5). The semiconductor integrated circuit chips and the bonding wires are then sealed by potting the resin (S6) which is then cured by baking (S7). Finally, a metal cap is secured onto the card substrate by adhesion or by plastic insert molding.

As described above, the varistors are first mounted on the card substrate and, then, the semiconductor integrated circuit chips are die-bonded or wire-bonded. Therefore, the protection by the varistors is accomplished at the time of assembling the IC card, contributing to improving the yield of the IC card. The varistors, however, may be mounted afterwards depending upon the convenience in the production, such as temperature conditions, etc.

<Data Recovery Terminals>

Figure 23:
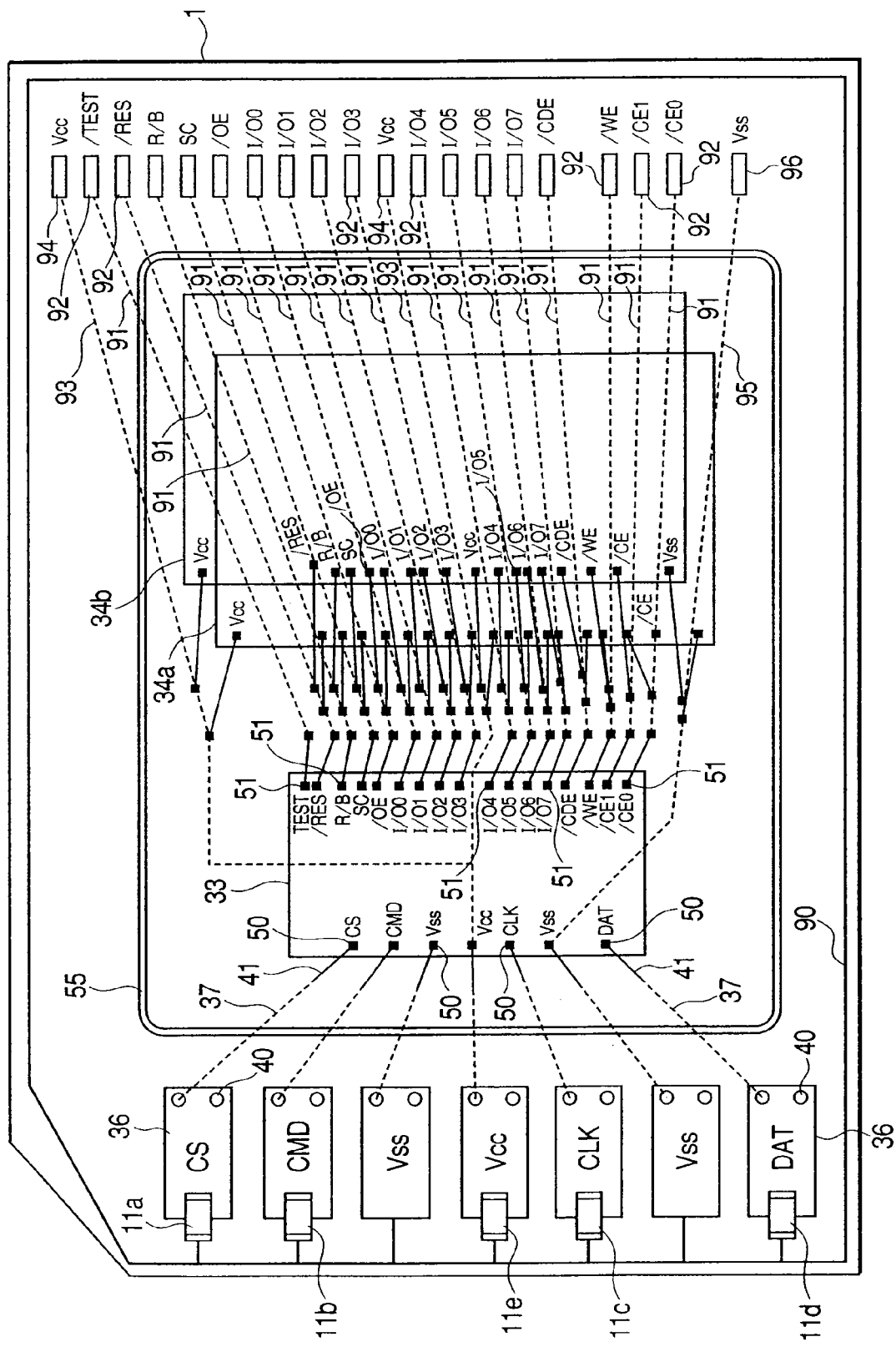
FIG. 23 is a plan view of an IC card giving attention to recovering the data.

FIG. 23 illustrates an IC card giving attention to recovering the data. The basic constitution is the same as FIG. 5, and the difference is the possession of plural data recovery terminals. In FIG. 23, the connection between the control latch 33 and the nonvolatile memory chips 34a, 34b is simplified in order to emphasize the connection to the data recovery terminals. In FIG. 23, the circuit elements having the same functions as those of FIG. 5 are denoted by the same reference numerals, but their detailed description is not repeated.

Though not diagramed in FIG. 5, the controller latch 33 has an input terminal (also simply written as test terminal /TEST) for receiving a test signal /TEST pulled up in the circuit as one of the external terminals 51. When a low level is input, the test terminal /TEST controls the interface terminal to the nonvolatile memory chips 34a, 34b and, controls, particularly, the output terminal and the input/output terminal to assume a state of a high output impedance or to assume a state in which the input/output operation cannot be executed.

On the card substrate 1 are formed data recovery terminals 92 that are connected to all external terminals 51 of the controller chip 33 on the side of the memory interface in a one-to-one manner through wirings 91. There are further provided a ground terminal 96 for recovering the data that is connected, through a wire 95, to an external terminal for the ground power source Vss among the external terminals 50 of the controller chip 33 on the side of the cathode interface, and a power source terminal 94 for recovering the data that is connected, through a wire 93, to an external terminal for the power source voltage Vcc among the external terminals 50 of the controller chip 33 on the side of the card interface. In FIG. 23, reference numeral 90 denotes a guard ring added to the card substrate 1 for preventing the electrostatic damage. The guard ring 90 surrounds the card substrate 1 and is connected to the ground power source terminal of the circuit.

The data evaluation terminals 92, 94 and 96 have been formed on the card substrate 1. When the memory control operation cannot be executed for the controller chip 33 due to the electrostatic damage, therefore, access can be made directly to the nonvolatile memory chips 34a, 34b from an external unit through the data evaluation terminals 92, 94 and 96. Therefore, even when the controller chip 33 is damaged, the data that are remaining in the nonvolatile memory chips 34a, 34b can be easily recovered.

The controller chip 33 may have a privacy protection function that executes the encryption for the data to be written into the nonvolatile memory and executes the decryption for the data read out from the nonvolatile memory. In this case, the data are recovered by the manufacturer of the IC card or by an authorized person by decrypting the data read out from the nonvolatile memory chips.

<Method of Recovering the Data>

Figure 24:
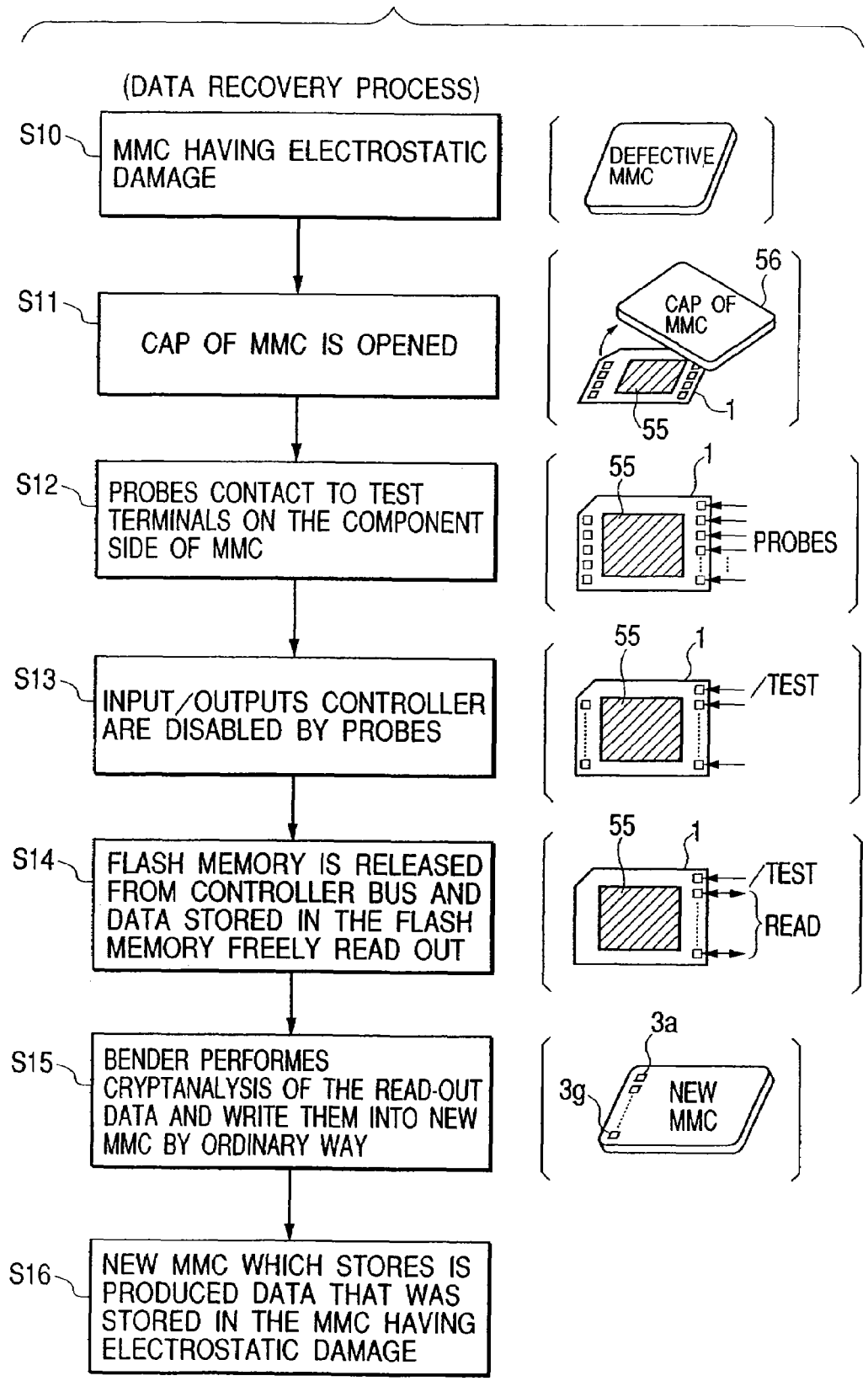
FIG. 24 is a flowchart illustrating a procedure of a data recovery processing for an IC card having data evaluation terminals.
Figure 25A:
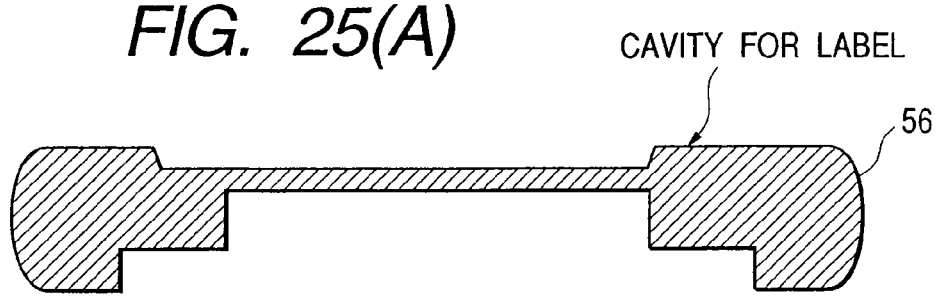
FIG. 25 is a diagram illustrating several kinds of structures of metal caps.
Figure 25B:
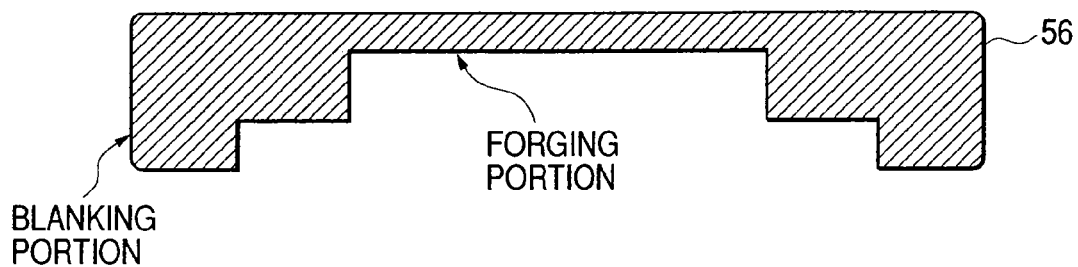
Figure 25C:
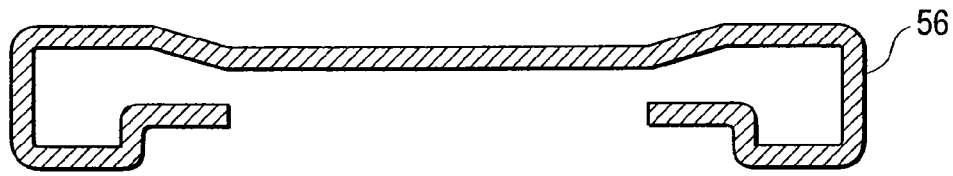
Figure 25D:
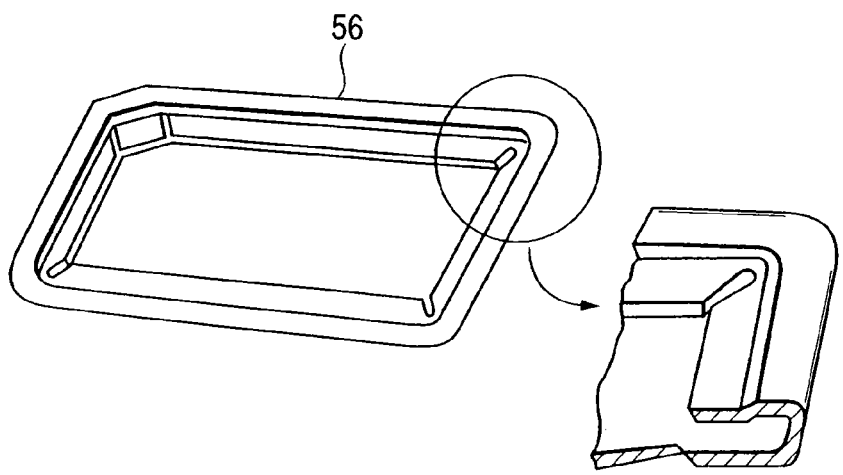

FIG. 24 illustrates a procedure of a data recovery processing for the IC card equipped with the data evaluation terminals.

The data are recovered from a multi-media card (MMC) of which the controller became defective due to electrostatic damage that could not be prevented by the input protection circuit or the varistors (S10). The data can further be recovered from those multi-media cards (MMC) of which the connection terminals were physically damaged. First, the cap 56 is removed from the object MMC (S11), and a probe such as a tester is brought into contact with the data evaluation terminals 92, 94, 96 (S12). Then, the terminal for receiving the test signal /TEST is fixed to the low level, and the memory interface terminal of the controller chip 33 is controlled to assume a high impedance state (state in which the input/output operation cannot be executed) (S13). Thus, the nonvolatile memory chip contained in the MMC is released from the control operation by the controller chip, and becomes accessible directly through the data evaluation terminals 92, 94, 96. In this state, the data are read out from the nonvolatile memory chip (S14). Here, the controller chip 33 has the privacy protection function that executes the encryption for the data that are written into the nonvolatile memory chip and executes the decryption for the data read out from the nonvolatile memory. Therefore, the data that are read out are decrypted without passing through the controller chip 33. The thus decrypted data are written into a new MMC in an ordinary manner through the connection terminals 3a to 3g (S15). Thus, the new MMC having the recovered data is offered to the user (S16). Here, the specifications of encryption of the controller chip can be confirmed by a production trace code of the card or by a production code written in the nonvolatile memory.

Thus, even in case the input circuit of the controller chip 33 is electrostatically damaged, the data that remain safe in the nonvolatile memory chips 34a, 34b can be easily recovered.

<Flush Memory Chip>

Figure 26:
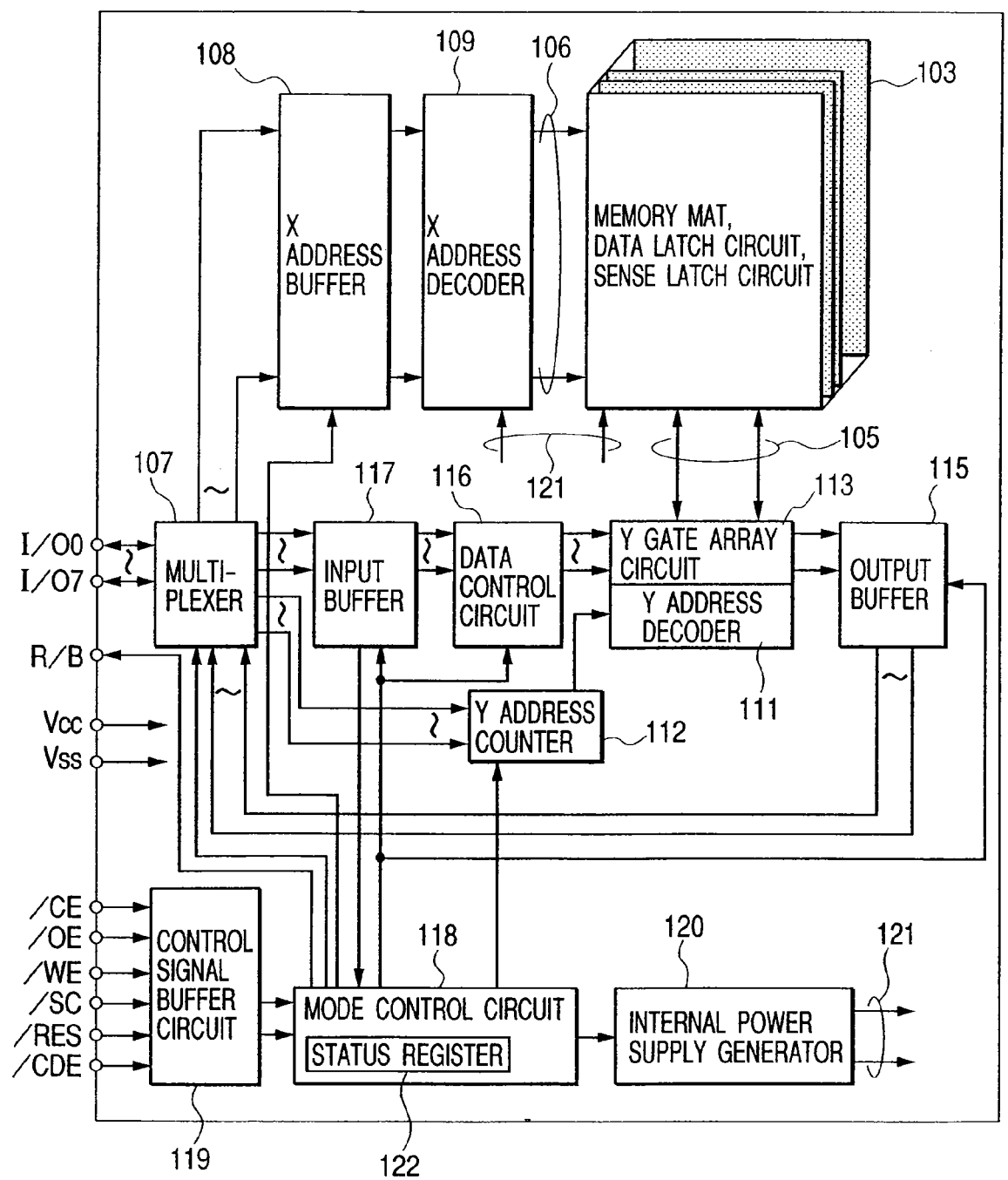
FIG. 26 is a block diagram illustrating the constitution of a flush memory chip.
Figure 27:
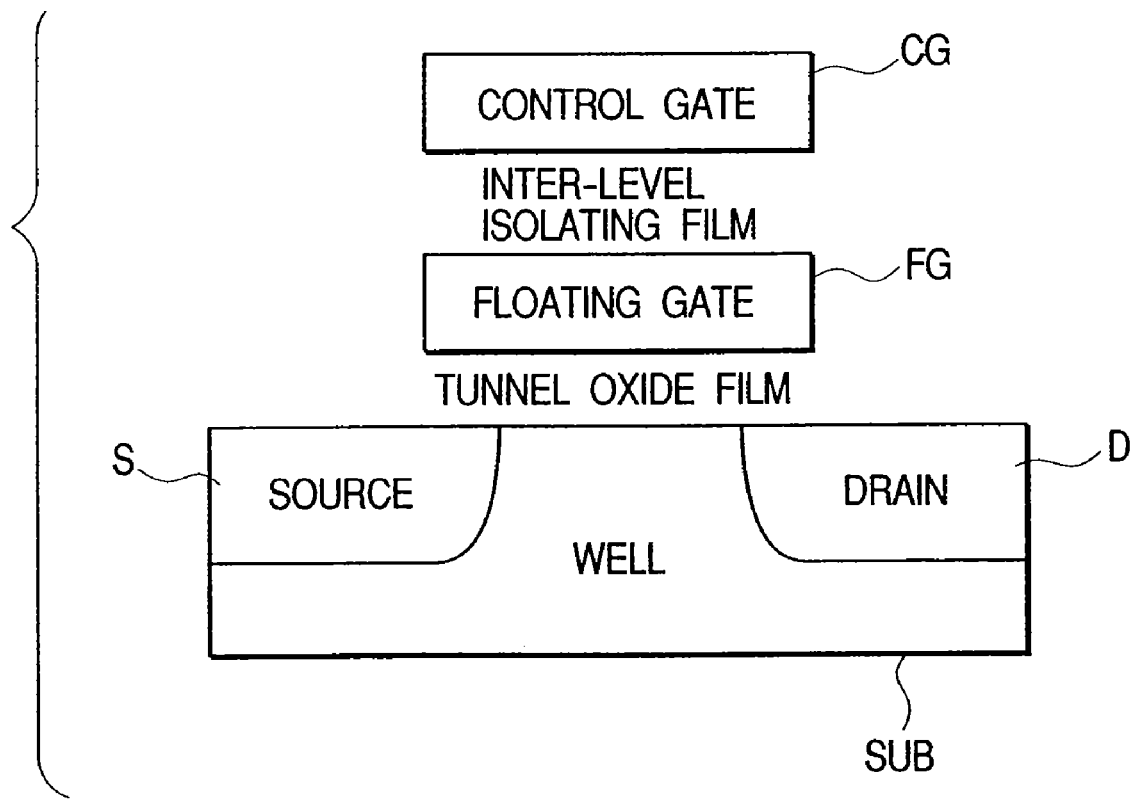
FIG. 27 is a sectional view schematically illustrating the structure of a nonvolatile memory cell transistor for the flush memory chip.

Here, the flush memory chip will be described. FIG. 26 illustrates a flush memory chip. In FIG. 26, reference numeral 103 denotes a memory array which includes a memory mat, a data latch circuit and a sense latch circuit. The memory mat 103 has many electrically erasable and writable nonvolatile memory cell transistors. As shown in FIG. 27, the memory cell transistor is constituted by a source S and a drain D formed in the semiconductor substrate or in a memory well SUB, a floating gate FG formed in the channel region via a tunnel oxide film, and a control gate CG overlapped on the floating gate-via an interlayer-insulating film. The control gate CG is connected to a word line 106, the drain D is connected to a bit line 105, and the source S is connected to a source line that is not shown.

The external input/output terminals I/O0 to I/O7 are also used as an address input terminal, a data input terminal, a data output terminal and a command input terminal. An X-address signal input through the external input/output terminals I/O0 to I/O7 is fed to an X-address buffer 108 through a multiplexer 107. An X-address decoder 109 decodes internal complementary address signals output from the X-address buffer 108 to drive the word line.

A sense latch circuit that is not shown is provided on one end side of the bit line 105, and a data latch circuit that is not shown is provided on the other side thereof. The bit line 105 is selected by a Y-gate array circuit 113 based on a selection signal output from a Y-address decoder 111. A Y-address signal input through the external input/output terminals I/O0 to I/O7 is preset to a Y-address counter 112, and an address signal which gradually increases starting from the preset value is given to the Y-address decoder 111.

When the data is being output, the bit line selected by the Y-gate array circuit 113 is rendered conductive to the input terminal of the output buffer 15. When the data is being input, the bit line selected by the Y-gate array circuit 113 is rendered conductive to the output terminal of the input buffer 117 through a data control circuit 116. The connection among the output buffer 115, input buffer 117 and the input/output terminals I/O0 to I/O7, is controlled by the multiplexer 107. A command fed through the input/output terminals I/O0 to I/O7 is given to a mode control circuit 118 via the multiplexer 107 and the input buffer 117. In addition to feeding the data through the input/output terminals I/O0 to I/O7, the data control circuit 116 feeds data of a logical value controlled by the mode control circuit 118 to the memory array 103.

A control signal buffer circuit 119 receives, as access control signals, the chip enable signal /CE, an output enable signal /OE, a write enable signal /WE, and a signal /SC for instructing the data latch timing, as well as a reset signal /RES and a command/data enable signal /CDE. The mode control circuit 118 controls a signal interface function to the external unit depending on the state of the signals, and further controls the internal operation according to a command code. When a command or a data is input to the input/output terminal I/O0 to I/O7, the signal /CDE is asserted. When it is a command, a signal /WE is asserted and when it is a data, the signal /WE is negated. When an address is input, the signal /CDE is negated and the signal /WE is asserted. Accordingly, the mode control circuit 118 distinguishes the command, data and address that are input in a multiplex manner through the external input/output terminals I/O0 to I/O7. The mode control circuit 118 asserts a ready/busy signal R/B during the erasing or writing operation, and informs an external unit of the state thereof.

An internal power source circuit 120 forms various operation sources 121 for writing, erasing, verifying and reading, and feeds them to the X-address decoder 109 and to the memory cell array 103.

The mode control circuit 118 controls the flush memory as a whole according to the command. The operation of the flush memory is basically determined by the command. The command assigned to the flush memory is read out, erased or written.

The flush memory has a status register 122 for indicating the internal state, and its content can be read out through the input/output terminal I/O0 to I/O7 by asserting the signal /OE.

In the foregoing were concretely described the invention accomplished by the present inventors by way of an embodiment. It should, however, be noted that the invention is in no way limited thereto only but can be modified in a variety of ways without departing the spirit and scope of the invention.

For example, the present invention can be applied to the memory cards other than the multi-media card, such as a compact flush memory and the like. Further, the structure in which the memory chips are stacked in a deviated manner, the structure in which the through holes are deviated from the connection terminals of the IC card, the structure in which the through holes are formed outside the molding region, the structure for stitch-bonding the stacked semiconductor integrated circuit chips and arranging the CS input terminals at the end of the chips, the IC card in which the stacked nonvolatile memories are mounted being divided into plural groups, and the IC card having note and data recovery terminals, are not necessarily limited to those constitutions having varistors. The memory mounted on the IC card of the present invention is not limited to the nonvolatile memory but may be a volatile memory (SRAM, DRAM, etc.). Further, the IC card may be the one mounting both the nonvolatile memory and the volatile memory.

The foregoing description has dealt with the case where the invention accomplished by the present inventors was adapted to a memory card in a field of art that served as the background of the invention. The present invention, however, is in no way limited thereto only, but can be applied to IC cards such as a bankbook, a credit card, an ID card, etc.

Briefly described below are the effects obtained by representative examples of the invention disclosed in this application.

That is, an IC card is provided that is capable of reinforcing the prevention of the electrostatic damage without increasing the cost of the semiconductor integrated circuit chip.

It is allowed to reinforce the prevention of the electrostatic damage by externally attaching the overvoltage protection elements to the semiconductor integrated circuit chip without causing a great change in the size and thickness of the IC card.

It is expected to prevent the electrostatic damage to the IC card due to unexpected handling by a person who is not familiar with.

There is provided an IC card capable of easily recovering the data in the memory card when the data remain safe in the memory even when the input circuit of the semiconductor integrated circuit chip is electrostatically damaged.

It is allowed to avoid the wiring patterns or the bonding wires from being densely concentrated, that could become a cause of malfunction due to undesired leakage of the signal lines even though a vacant region is decreased on the card substrate of the IC card due to the countermeasure against the electrostatic damage by externally attaching circuit elements such as varistors or the like.

It is allowed to realize an IC card having a relatively large storage capacity despite of its relatively small size.

What is claimed is:

1. A memory card comprising:
a substrate having a first side, a second side extending in a direction perpendicular to said first side, a front surface and a rear surface opposite to said front surface;
a plurality of conductive patterns arranged over said front surface of said substrate and arranged along said first side;
a first flash memory chip and a controller chip for said first flash memory chip arranged over said front surface of said substrate; and
a plurality of external terminals arranged over said rear surface of said substrate and electrically connected to said conductive patterns via a plurality of through holes,
wherein said memory card further comprises an overvoltage protection element arranged over said front surface of said substrate and connected to at least one of said conductive patterns,
wherein, in a direction away from said first side and along said second side, said conductive patterns, said controller chip and said first flash memory chip are arranged in order of said conductive patterns, said controller chip and said first flash memory chip.

2. A memory card according to the claim 1,
wherein a direction along said second side is an insertion direction for use of said memory card.

3. A memory card according to the claim 1,
wherein said memory card further comprises a plurality of test terminals arranged over said substrate and electrically connected to said first flash memory chip.

4. A memory card according to the claim 3,
wherein, in a direction away from said first side and along said second side, said conductive patterns, said controller chip, said first flash memory chip and said test terminals are arranged in order of said conductive patterns, said controller chip, said first flash memory chip and said test terminals.

5. A memory card according to claim 1,
wherein said external terminals include a CLK terminal, a DAT terminal and a CMD terminal.

6. A memory card according to claim 1,
wherein the number of said external terminals is 7.

7. A memory card according to claim 1,
wherein a planar area of said first flash memory chip is larger than that of said controller chip.

8. A memory card according to claim 1, further comprising a second flash memory chip.

9. A memory card according to claim 8,
wherein said second flash memory chip is stacked over said first flash memory chip.

10. A memory card according to claim 1,
wherein planar dimensions of said memory card are set to 32 mm×24 mm.

11. A memory card according to claim 1,
wherein a length of said second side of said memory card is set to 24 mm, and
wherein a length of said first side of said memory card is set to 18 mm.

12. A memory card according to claim 1,
wherein a thickness of said memory card is set to 1.4 mm.

13. A memory card according to claim 1,
wherein resin is molded over said conductive patterns, said controller chip, said first flash memory chip and said over-voltage protection element.

14. A memory card comprising:
a substrate having a first side, a second side extending in a direction perpendicular to said first side, a front surface and a rear surface opposite to said front surface;
a plurality of conductive patterns arranged over said front surface of said substrate and arranged along said first side;
a first flash memory chip and a controller chip for said first flash memory chip arranged over said front surface of said substrate; and
a plurality of external terminals arranged over said rear surface of said substrate and connected to said conductive patterns via a plurality of through holes,
wherein said memory card further comprises an over-voltage protection element arranged over said front surface of said substrate and connected to at least one of said conductive patterns,
wherein said memory card further comprises a plurality of test terminals arranged over said substrate and connected to said first flash memory chip,
wherein resin is molded over said conductive patterns, said controller chip, said first flash memory chip and said over-voltage protection element,
wherein said test terminals are exposed from said resin, and
wherein, in a direction away from said first side and along said second side, said conductive patterns, said controller chip, said first flash memory chip and said test terminals are arranged in order of said conductive patterns, said controller chip, said first flash memory chip and said test terminals.

15. A memory card according to the claim 14,
wherein a direction along said second side is an insertion direction for use of said memory card.

16. A memory card according to claim 14,
wherein said external terminals include a CLK terminal, a DAT terminal and a CMD terminal.

17. A memory card according to claim 14,
wherein the number of said external terminals is 7.

18. A memory card according to claim 14,
wherein a planar area of said first flash memory chip is larger than that of said controller chip.

19. A memory card according to claim 14, further comprising a second flash memory chip.

20. A memory card according to claim 19,
wherein said second flash memory chip is stacked over said first flash memory chip.

21. A memory card according to claim 14,
wherein planar dimensions of said memory card are set for 32 mm×24 mm.

22. A memory card according to claim 14,
wherein a length of said second side of said memory card is set to 24 mm, and
wherein a length of said first side of said memory card is set to 18 mm.

23. A memory card according to claim 14,
wherein a thickness of said memory card is set to 1.4 mm.

* * * * *